United States Patent
Hase et al.

(10) Patent No.: US 12,407,304 B2
(45) Date of Patent: Sep. 2, 2025

(54) POWER AMPLIFIER MODULE

(71) Applicant: Murata Manufacturing Co., Ltd., Kyoto (JP)

(72) Inventors: Masatoshi Hase, Kyoto (JP); Hitoshi Akamine, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 857 days.

(21) Appl. No.: 17/376,780

(22) Filed: Jul. 15, 2021

(65) Prior Publication Data

US 2022/0021350 A1  Jan. 20, 2022

(30) Foreign Application Priority Data

Jul. 17, 2020 (JP) .................. 2020-122668

(51) Int. Cl.
*H03F 1/42* (2006.01)
*H03F 3/24* (2006.01)

(52) U.S. Cl.
CPC ............... *H03F 1/42* (2013.01); *H03F 3/245* (2013.01); *H03F 2200/171* (2013.01); *H03F 2200/451* (2013.01)

(58) Field of Classification Search
CPC ...... H03F 1/42; H03F 3/245; H03F 2200/171; H03F 2200/451; H03F 3/195; H03F 3/68; H03F 3/72; H03F 2203/7209; H03F 3/211; H04B 1/0458; H04B 2001/0408; H04B 1/04
USPC ............................................. 330/295, 124 R
See application file for complete search history.

(56) References Cited

U.S. PATENT DOCUMENTS

| | | | |
|---|---|---|---|
| 8,130,039 B2 * | 3/2012 | Dishop | H03F 3/211 330/276 |
| 8,593,219 B1 * | 11/2013 | Root | H03F 1/0288 330/124 R |
| 2011/0309884 A1 | 12/2011 | Dishop | |
| 2013/0099866 A1 * | 4/2013 | Conradi | H03F 1/0288 330/126 |
| 2016/0191105 A1 | 6/2016 | King et al. | |
| 2017/0104456 A1 | 4/2017 | Motoi et al. | |

FOREIGN PATENT DOCUMENTS

| | | |
|---|---|---|
| JP | 2016042699 A | 3/2016 |
| WO | 2015133003 A1 | 9/2015 |

* cited by examiner

*Primary Examiner* — Andrea Lindgren Baltzell
*Assistant Examiner* — Khiem D Nguyen
(74) *Attorney, Agent, or Firm* — McDonald Hopkins LLC

(57) ABSTRACT

A power amplifier module includes a first amplifier that amplifies a power level of a first input signal in a predetermined frequency band and outputs a first signal of a first power level; a first impedance transformer connected to the first amplifier and including a transmission line transformer; a second amplifier that amplifies a power level of a second input signal in the predetermined frequency band and outputs a second signal of the first power level; a second impedance transformer connected to the second amplifier and including a transmission line transformer; and a combiner that combines the first signal inputted through the first impedance transformer and the second signal inputted through the second impedance transformer into an output signal of a second power level larger than the first power level and includes a transmission line transformer.

19 Claims, 13 Drawing Sheets

POWER AMPLIFIER MODULE

CROSS REFERENCE TO RELATED APPLICATION

This application claims priority from Japanese Patent Application No. 2020-122668 filed on Jul. 17, 2020. The content of this application is incorporated herein by reference in its entirety.

BACKGROUND OF THE DISCLOSURE

1. Field of the Disclosure

The present disclosure relates to a power amplifier module.

2. Description of the Related Art

In recent years, in mobile terminals, for a radio frequency (RF) front-end circuit, a device supporting multiple frequency bands specified in the third generation partnership project (3GPP) is used. Furthermore, high-speed communications are demanded, and multiband operation using multiple frequency bands simultaneously is therefore adopted. Thus, a technique is disclosed in which signals amplified by respective amplifiers of two systems are combined to generate a signal compliant with an intended communication standard (see Japanese Unexamined Patent Application Publication No. 2016-42699).

In a front-end circuit disclosed in Japanese Unexamined Patent Application Publication No. 2016-42699, 3G/4G signals of the two systems are combined by a power combiner including a matching network and a band selection switch, and then a 2G signal is outputted through an impedance transformation circuit. However, in the front-end circuit, an LC ladder circuit is used for the matching network, and thus a wider bandwidth is not able to be achieved.

Furthermore, International Publication No. WO2015/133003A1 discloses an amplifier circuit that combines amplified signals. The amplifier circuit disclosed in International Publication No. WO2015/133003A1 combines signals through respective quarter-wave lines provided in two respective systems to generate an output signal. However, in the amplifier circuit disclosed in International Publication No. WO2015/133003A1, output matching is performed by using quarter-wave lines whose optimum line lengths differ according to a frequency, and thus it is difficult to achieve a wider bandwidth. In other words, in the amplifier circuit, wideband signals are not able to be combined. Furthermore, the area occupied by each quarter-wave line in the circuit is large, thus resulting in an increase in module size.

BRIEF SUMMARY OF THE DISCLOSURE

Thus, the present disclosure has been made to appropriately combine wideband signals while achieving a reduction in module size.

A power amplifier module according to one aspect of the present disclosure includes a first amplifier configured to amplify a power level of a first input signal in a predetermined frequency band and output a first signal of a first power level; a first impedance transformer connected to the first amplifier and including a transmission line transformer; a second amplifier configured to amplify a power level of a second input signal in the predetermined frequency band and output a second signal of the first power level; a second impedance transformer connected to the second amplifier and including a transmission line transformer; and a combiner configured to combine the first signal inputted through the first impedance transformer and the second signal inputted through the second impedance transformer into an output signal of a second power level larger than the first power level and including a transmission line transformer.

The present disclosure can provide the power amplifier module that can appropriately combine wideband signals while achieving a reduction in module size. Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
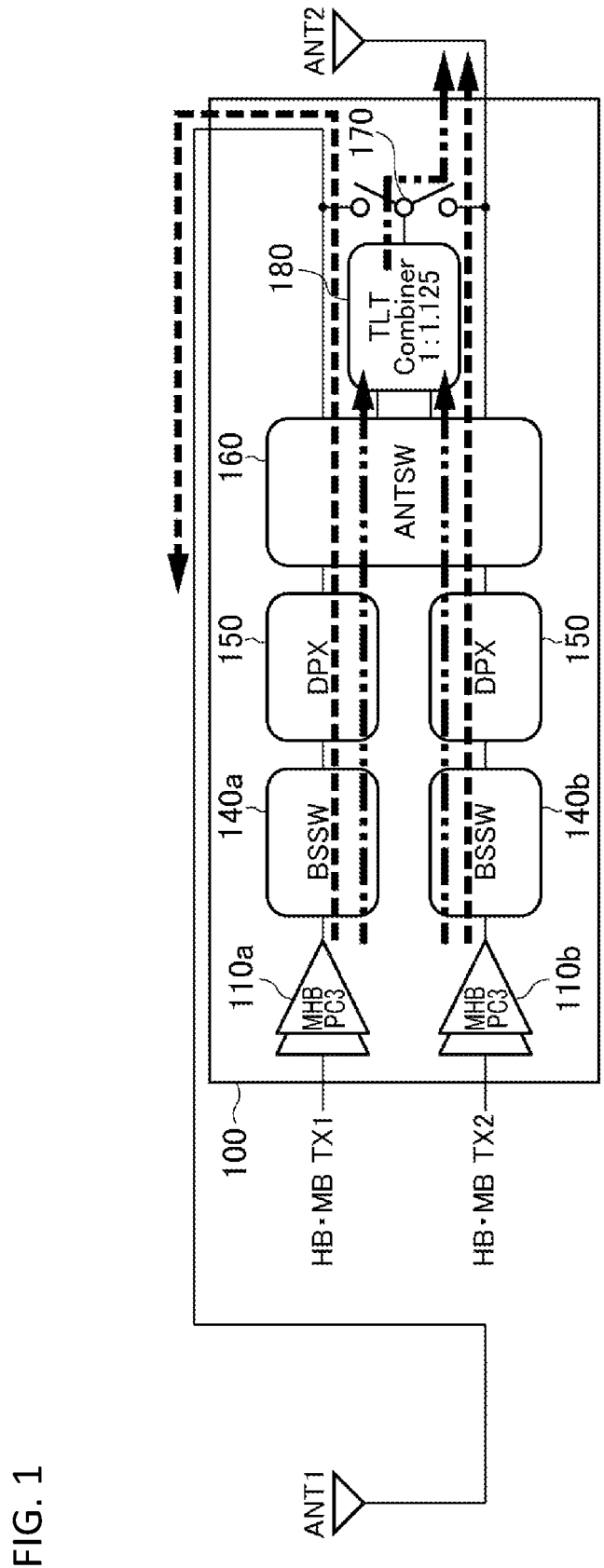
FIG. 1 illustrates an overview of a configuration of a power amplifier module according to a present embodiment.

Embodiments of the present disclosure will be described below with reference to the drawings. Here, circuit elements denoted by the same reference numerals are the same circuit element, and repeated descriptions of the circuit elements are omitted.

Configuration of Power Amplifier Module 100

An overview of a power amplifier module 100 according to a present embodiment will be described with reference to FIG. 1. FIG. 1 illustrates an overview of a configuration of the power amplifier module 100 according to the present embodiment. The power amplifier module 100 is incorporated, for example, in a mobile communication device, such as a cellular phone. The power amplifier module 100 amplifies the power of an input signal RFin to a level necessary for transmission to a base station and outputs this input signal RFin as an amplified signal RFout. The input signal RFin is a radio frequency (RF) signal modulated, for example, by a radio frequency integrated circuit (RFIC) or the like in accordance with a certain communication scheme. Examples of a communication standard of the input signal RFin include the second generation mobile communication system (2G), the third generation mobile communication system (3G), the fourth generation mobile communication system (4G), the fifth generation mobile communication system (5G), 5G new radio (5GNR), long term evolution (LTE)-frequency division duplex (FDD), LTE-time division duplex (TDD), LTE-Advanced, and LTE-Advanced Pro. The frequency of the input signal RFin ranges, for example, from about several hundred MHz to about several tens of GHz. The communication standard and frequency of the input signal RFin are not limited to these.

For example, between a mobile terminal using downlink multiple-input and multiple-output (MIMO), such as a mobile terminal supporting 5GNR, and a base station, a reference signal for grasping a radio wave propagation situation is transmitted before data communication. At this time, a reference signal is outputted to two antennas of a plurality of antennas incorporated in the mobile terminal. On the other hand, when an uplink is established from the mobile terminal to the base station, a PC2 transmission from one antenna and PC3 transmissions from two respective antennas are performed.

Here, each of PC2 and PC3 denotes "Power Class" representing an output level of a signal and is specified in 3GPP. With respect to PC3, for example, transmission power transmitted from an antenna of the mobile terminal is about 23 dBm. With respect to PC2, for example, transmission power transmitted from an antenna of the mobile terminal is about 26 dBm. In other words, PC2 is higher than PC3 in transmission power by about 3 dBm, and thus the output of PC2 is about twice the output of PC3.

Hence, in mobile terminals supporting 5GNR, for example, an aspect in which a reference signal is transmitted, an aspect in which a PC2 transmission from one antenna is performed, and an aspect in which PC3 transmissions from two respective antennas are performed have to be implemented. For at least these aspects, the power amplifier module 100 according to the present embodiment can achieve high-efficiency transmission.

First, an overview of the above-described aspects in the power amplifier module 100 will be described with reference to FIG. 1. In FIG. 1, as an example, communication paths that transmit PC3 signals from two respective antennas ANT1 and ANT2 are indicated by a dashed line, and a communication path that transmits a PC2 signal from one antenna ANT1 (or ANT2) is indicated by a dash-dot-dot line.

As illustrated in FIG. 1, an input signal RFin1 is inputted from a terminal TX1 to a first amplifier 110a, and an input signal RFin2 is inputted from a terminal TX2 to a second amplifier 110b. The first amplifier 110a and the second amplifier 110b are optimally designed, for example, for PC3.

In the power amplifier module 100, when PC3 signals are transmitted from the two respective antennas ANT1 and ANT2, an input signal RFin1 is transmitted to the antenna ANT1 through the first amplifier 110a, a first band selection switch 140a, a duplexer 150, and an antenna switch 160. Similarly, an input signal RFin2 is transmitted to the antenna ANT2 through the second amplifier 110b, a second band selection switch 140b, a duplexer 150, and the antenna switch 160. Although not illustrated in FIG. 1, behind the first and second band selection switches 140a and 140b, a plurality of duplexers 150 suited to respective bands may be connected.

On the other hand, in the power amplifier module 100, when a PC2 signal is transmitted from one antenna ANT2, an input signal RFin1 is inputted to a combiner 180 through the first amplifier 110a, the first band selection switch 140a, the duplexer 150, and the antenna switch 160. An input signal RFin2 is inputted to the combiner 180 through the second amplifier 110b, the second band selection switch 140b, the duplexer 150, and the antenna switch 160. The combiner 180 combines the input signal RFin1 of PC3 (amplified signal RFamp1) and the input signal RFin2 of PC3 (amplified signal RFamp2) and outputs a PC2 signal. Here, the combiner 180 includes a transmission line transformer. The signal outputted from the combiner 180 is transmitted to the antenna ANT2 through a path-changing switch 170.

In other words, the power amplifier module 100 can transmit PC3 signals to the respective antennas ANT1 and ANT2 of two systems by using two amplifiers optimally designed for PC3 and can further transmit a PC2 signal to the antenna ANT1 (or ANT2) of one system.

Figure 10:
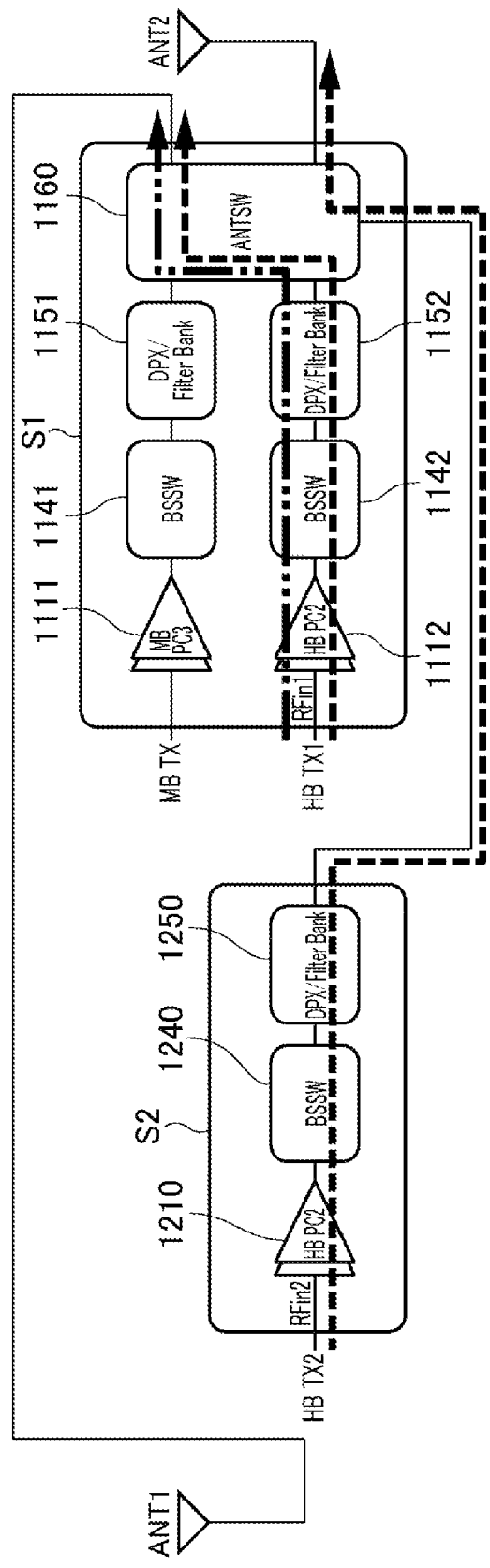
FIG. 10 illustrates an overview of a configuration of a power amplifier module according to a comparative example.

Here, a power amplifier module 1000 according to a comparative example will be described with reference to FIG. 10. FIG. 10 illustrates an overview of a configuration of the power amplifier module 1000 according to the comparative example. In FIG. 10, as an example, communication paths that transmit PC3 signals from the two respective antennas ANT1 and ANT2 are indicated by a dashed line, and a communication path that transmits a PC2 signal from one antenna ANT1 is indicated by a dash-dot-dot line.

In the power amplifier module 1000, when PC3 signals are transmitted from the two respective antennas ANT1 and ANT2, an input signal RFin1 is inputted to an amplifier 1112 provided in or on a given substrate S1, and an input signal RFin2 is inputted to an amplifier 1210 provided in or on a substrate S2 different from the given substrate S1. Here, each of the amplifiers 1112 and 1210 is optimally designed for PC2 to implement a PC2 transmission using one antenna. The input signals RFin1 and RFin2 are transmitted to the respective antennas ANT1 and ANT2 through band selection switches 1142 and 1240 and duplexers 1152 and 1250 that are provided in or on the different respective substrates S1 and S2, and through an antenna switch 1160 provided in or on the given substrate S1.

As described above, in comparison with the power amplifier module 1000 according to the comparative example, in the power amplifier module 100 according to the present embodiment, for example, the first amplifier 110a and the second amplifier 110b are optimally designed for PC3, thus enabling an increase in transmission efficiency.

Furthermore, in the power amplifier module 100, for example, PC3 signals are combined to generate a PC2 signal, and a component (substrate S2 of the power amplifier module 1000) for generating a PC2 signal is therefore unnecessary, enabling a reduction in the number of components and a reduction in package size. Additionally, since the combiner 180 includes the transmission line transformer, a wide frequency band including a middle band (MB) and a high band (HB) can be supported by one combiner 180. Furthermore, the combiner 180 is disposed on an antennas ANT1 and ANT2 side of the antenna switch 160, and thus impedances at input and output terminals of the antenna switch 160 are about 50 ohms, therefore making it possible to reduce power loss due to a resistance component of the antenna switch 160.

Figure 2:
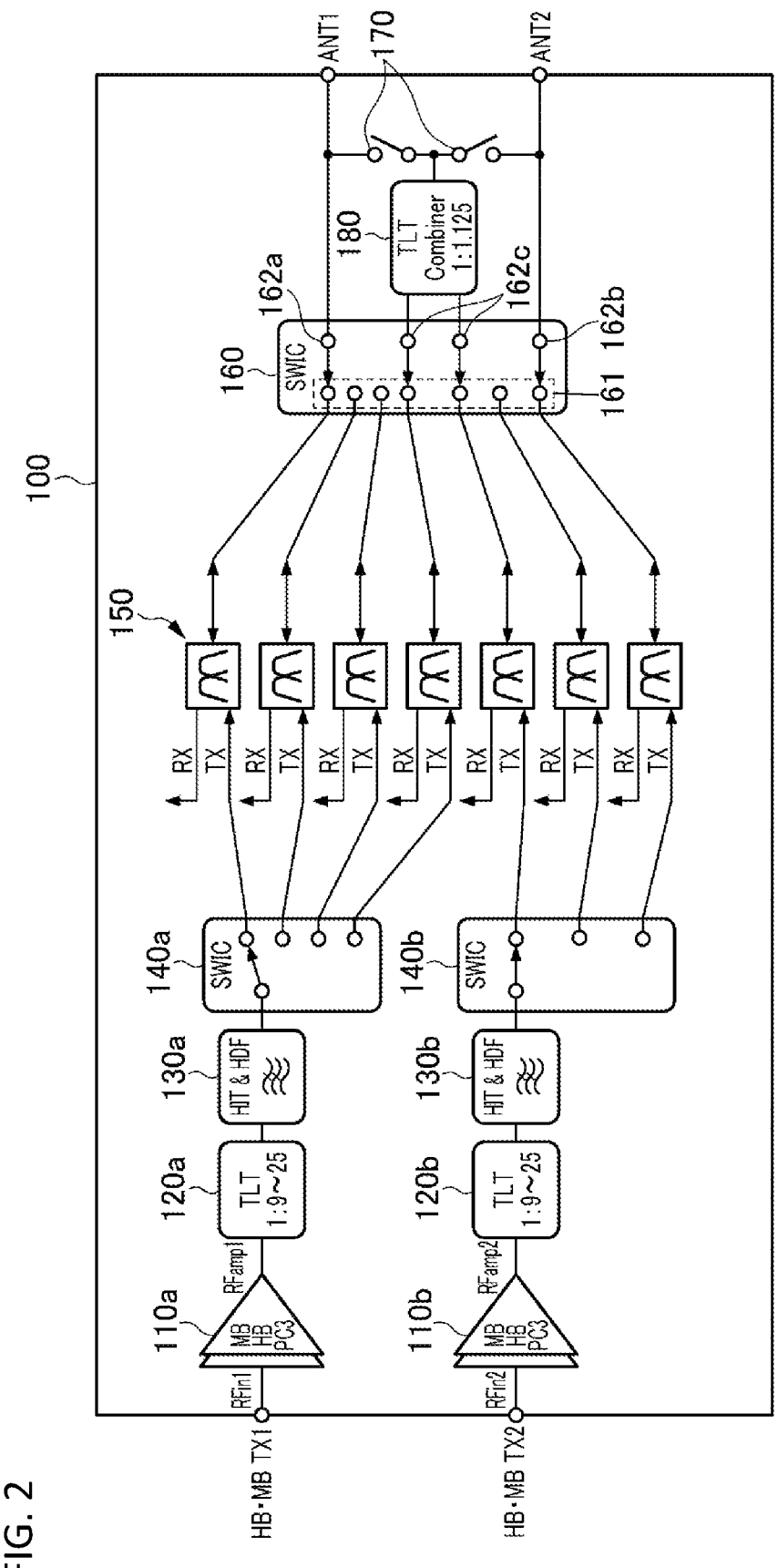
FIG. 2 illustrates an example of the configuration of the power amplifier module according to the present embodiment.

Next, the configuration of the power amplifier module 100 will be described in detail with reference to FIG. 2. FIG. 2 illustrates an example of the configuration of the power amplifier module 100 according to the present embodiment.

The power amplifier module 100 includes, for example, the first amplifier 110a, a first impedance transformer 120a, a first filter circuit 130a, the first band selection switch 140a, the second amplifier 110b, a second impedance transformer 120b, a second filter circuit 130b, the second band selection switch 140b, duplexers 150, the antenna switch 160, the path-changing switch 170, and the combiner 180. Each component will be described in detail below.

The first amplifier 110a is, for example, a circuit that amplifies a power level of an input signal RFin1 and outputs an amplified signal RFamp1. The first amplifier 110a supports, for example, input signals RFin1 in a frequency band (about 1710 MHz to about 2690 MHz) including the MB and the HB. The first amplifier 110a is optimally designed, for example, for PC3.

The first impedance transformer 120a is, for example, a circuit that performs impedance transformation at a predetermined transformation ratio, and includes a transmission line transformer. In FIG. 2, as an example, a transformation ratio of "1:9 to 25" is indicated. When the transmission line transformer is included, wideband and low-loss impedance transformation can be achieved. A transmission line transformer will be described in detail below.

The first filter circuit 130a subjects, for example, a signal in the frequency band including the MB and the HB to filtering. The first filter circuit 130a may be, for example, a fixed filter whose pass band is fixed at a specific frequency band, a variable filter whose pass band is varied in accordance with each of multiple frequency bands, or a filter obtained by combining the fixed filter and the variable filter such that they are switchable. Thus, attenuation characteristics in proximity to the pass band can be increased.

The first band selection switch (BSSW) 140a is, for example, a switch that distributes a plurality of high-frequency signals whose frequency bands are different to intended terminals. In the first band selection switch 140a, the amplified signal RFamp1 is inputted to an input terminal, and this signal is outputted from an intended output terminal.

The second amplifier 110b, the second impedance transformer 120b, the second filter circuit 130b, and the second band selection switch 140b are similar to the first amplifier 110a, the first impedance transformer 120a, the first filter circuit 130a, and the first band selection switch 140a, and thus a description thereof is omitted.

In other words, high-frequency signals being substantially equal in phase and amplitude are inputted to the first amplifier 110a and the second amplifier 110b. Then, the two amplifiers 110a and 110b amplify the input high-frequency signals and output the high-frequency signals being substantially equal in phase and amplitude. The high-frequency signals amplified by the two amplifiers 110a and 110b are subjected to impedance transformation in transmission line transformers in the respective impedance transformers 120a and 120b and then are outputted to duplexers 150.

Each of the duplexers (DPXs) 150 is, for example, a filter circuit that, when a transmission frequency and a reception frequency are different, switches between transmission and reception. The duplexers 150 are connected, for example, between output terminals of the first and second band selection switches 140a and 140b and input terminals 161 of the antenna switch 160 to be described. FIG. 2 illustrates distribution of an amplified signal RFamp1 and a reception signal RX by a duplexer 150. Incidentally, if a communication scheme is, for example, a time division duplex (TDD) scheme, the duplexers 150 may be omitted. Instead, the duplexer 150 may be replaced by typical band pass filters.

The antenna switch (ANTSW) 160 is, for example, a switch that switches between a path connected to each of the antennas ANT1 and ANT2 and a path connected to the combiner 180 to be described. Thus, it can be determined selectively whether to output PC3 signals to the respective antennas ANT1 and ANT2 or to input two PC3 signals to the combiner 180 to output a PC2 signal.

Specifically, the antenna switch 160 includes, for example, the input terminals 161, a first output terminal 162a, a second output terminal 162b, and third output terminals 162c. The input terminals 161 are, for example, terminals that are connected to the respective duplexers 150 and to which an amplified signal RFamp1 and an amplified signal RFamp2 are inputted. The first output terminal 162a is, for example, a terminal connected to the antenna ANT1 so as to output the amplified signal RFamp1 to the antenna ANT1. The second output terminal 162b is, for example, a terminal connected to the antenna ANT2 so as to output the amplified signal RFamp2 to the antenna ANT2. The third output terminals 162c are, for example, terminals connected to the combiner 180 so as to output the amplified signal RFamp1 and the amplified signal RFamp2 to the combiner 180.

The path-changing switch 170 is a switch that distributes a signal outputted from the combiner 180 to be described to an intended antenna.

The combiner 180 is, for example, a circuit that combines PC3 signals that are the amplified signals RFamp1 and RFamp2 to generate a PC2 signal. The combiner 180 is connected between the antenna switch 160 and the antennas ANT1 and ANT2. Thus, impedances at all input and output terminals of the antenna switch 160 are substantially 50 ohms, therefore making it possible to reduce power loss due to a resistance component of the antenna switch 160. The combiner 180 is constructed, for example, by combining transmission line transformers. When the combiner 180 includes the transmission line transformers, wideband and low-loss impedance transformation can be achieved.

First, a structure of a transmission line transformer 190 will be described below with reference to FIGS. 3A and 3B. Then, variations of the combiner 180 obtained by combining transmission line transformers 190 will be described with reference to FIGS. 4 to 8.

Figure 3A:
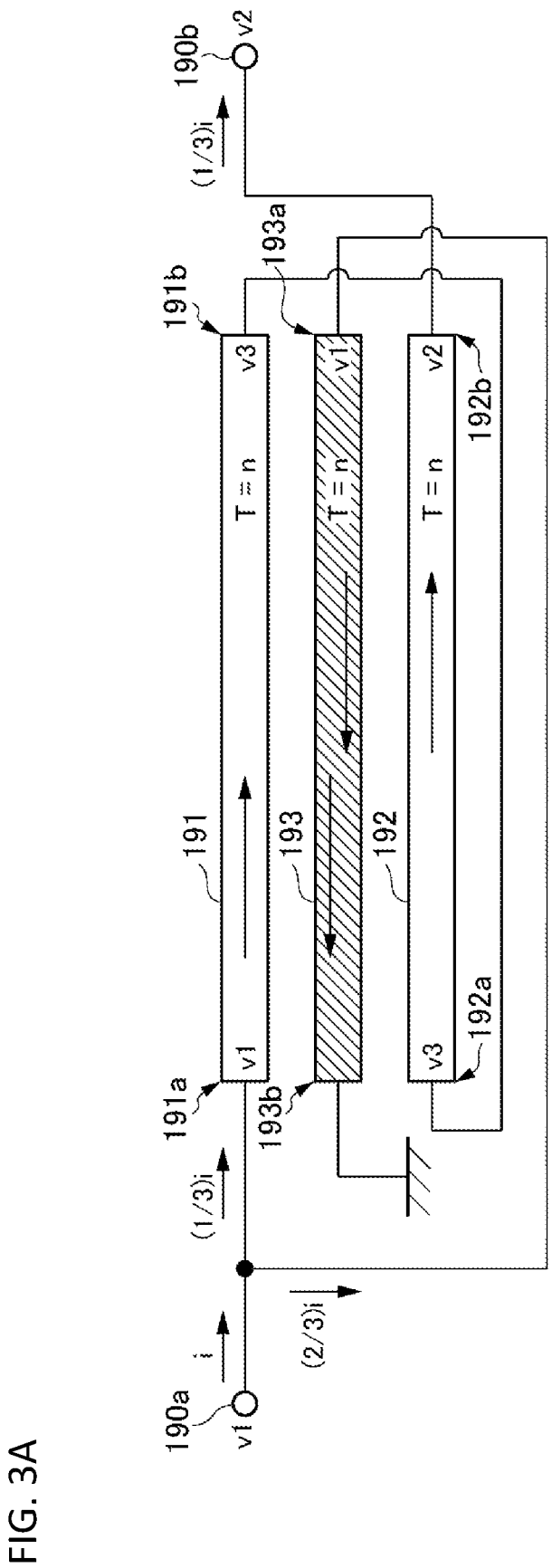
FIG. 3A schematically illustrates an example of a transmission line transformer.

FIG. 3A schematically illustrates an example of the transmission line transformer 190. FIGS. 3B and 3C are perspective views schematically illustrating an example of the structure of the transmission line transformer 190.

As illustrated in FIG. 3A, the transmission line transformer 190 includes, for example, a first transmission line 191, a second transmission line 192, and a third transmission line 193. First, alternating currents (AC) that flow through the first transmission line 191, the second transmission line 192, and the third transmission line 193 will be described. A current that flows from an input terminal 190a toward an output terminal 190b flows first from, of the first transmission line 191, a first end portion 191a toward a second end portion 191b. Then, the current flows from a third end portion 192a toward a fourth end portion 192b in the second transmission line 192. The magnitude of the AC current that flows through the first transmission line 191 is equal to the magnitude of the AC current that flows through the second transmission line 192. In the third transmission line 193, an odd mode current is induced from a fifth end portion 193a toward a sixth end portion 193b by the AC current that flows through the first transmission line 191. In the third transmission line 193, an odd mode current is induced from the fifth end portion 193a toward the sixth end portion 193b by the AC current that flows through the second transmission line 192. A direction of an odd mode current induced in the third transmission line 193 is opposite to directions of the AC currents that flow through the first transmission line 191 and the second transmission line 192. The odd mode current caused by the current that flows through the first transmission line 191 and the odd mode current caused by the current that flows through the second transmission line 192 are equal in magnitude and direction.

In other words, in the third transmission line 193, the odd mode current derived from the first transmission line 191 and the odd mode current derived from the second transmission line 192 are superimposed and flow. For this reason, in the third transmission line 193, an odd mode current is induced whose magnitude is twice the magnitude of a current that flows through a series circuit composed of the first transmission line 191 and the second transmission line 192. When the magnitude of a current that flows from the input terminal 190a into the transmission line transformer 190 is denoted by i, a current of (⅓)i flows through the series circuit composed of the first transmission line 191 and the second transmission line 192, and a current of (⅔)i flows through the third transmission line 193. Hence, the magnitude of the current outputted from the output terminal 190b is (⅓)i.

Next, a voltage will be described. A voltage at the input terminal 190a is denoted by v1, and a voltage at the output terminal 190b is denoted by v2. A voltage at the first end portion 191a of the first transmission line 191 and a voltage at the fifth end portion 193a of the third transmission line 193 are equal to the voltage v1 at the input terminal 190a. A voltage at the fourth end portion 192b of the second transmission line 192 is equal to the voltage v2 at the output terminal 190b. A voltage at the second end portion 191b of the first transmission line 191 is denoted by v3. A voltage at the third end portion 192a of the second transmission line 192 is equal to the voltage v3 at the second end portion 191b of the first transmission line 191. A voltage at the sixth end portion 193b of the third transmission line 193 is 0 V.

A potential difference between the first end portion 191a and the second end portion 191b of the first transmission line 191 is equal to a potential difference between the sixth end portion 193b and the fifth end portion 193a of the third transmission line 193, and thus an equation of v1−v3=0−v1 holds. Similarly, for a relationship between the second transmission line 192 and the third transmission line 193, an equation of v3−v2=0−v1 holds. When the simultaneous equations are solved, 3×v1=v2 is obtained. Thus, the voltage v2 at the output terminal 190b is three times the voltage v1 at the input terminal 190a.

When a load having an impedance R2 is connected to the output terminal 190b, an equation of v2=(⅓)i×R2 holds. When an impedance as seen from the input terminal 190a looking toward a load side is denoted by R1, an equation v1=R1×i holds. When these equations are solved, R1=(⅑)R2 is obtained. Thus, the impedance R1 as seen from the input terminal 190a looking toward the load side is ⅑ times the impedance R2 of the load connected to the output terminal 190b. On the other hand, when the load is connected to the input terminal 190a, an impedance as seen from the output terminal 190b looking toward a load side is nine times an impedance of the load connected to the input terminal 190a. Thus, the transmission line transformer 190 according to the present embodiment functions as an impedance transformation circuit with an impedance transformation ratio of nine.

Figure 3B:
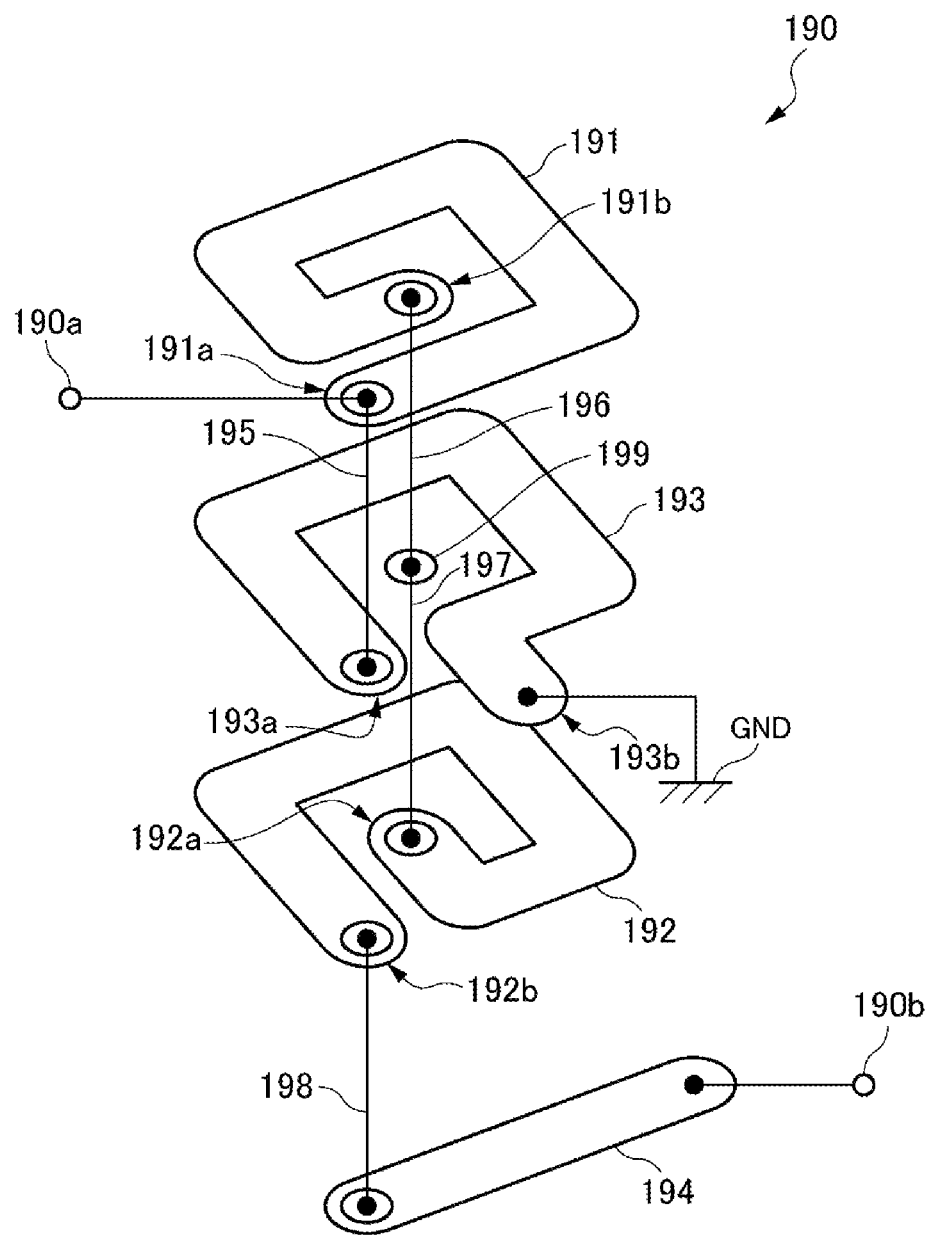
FIG. 3B is a perspective view schematically illustrating an example of a structure of the transmission line transformer.
Figure 3C:
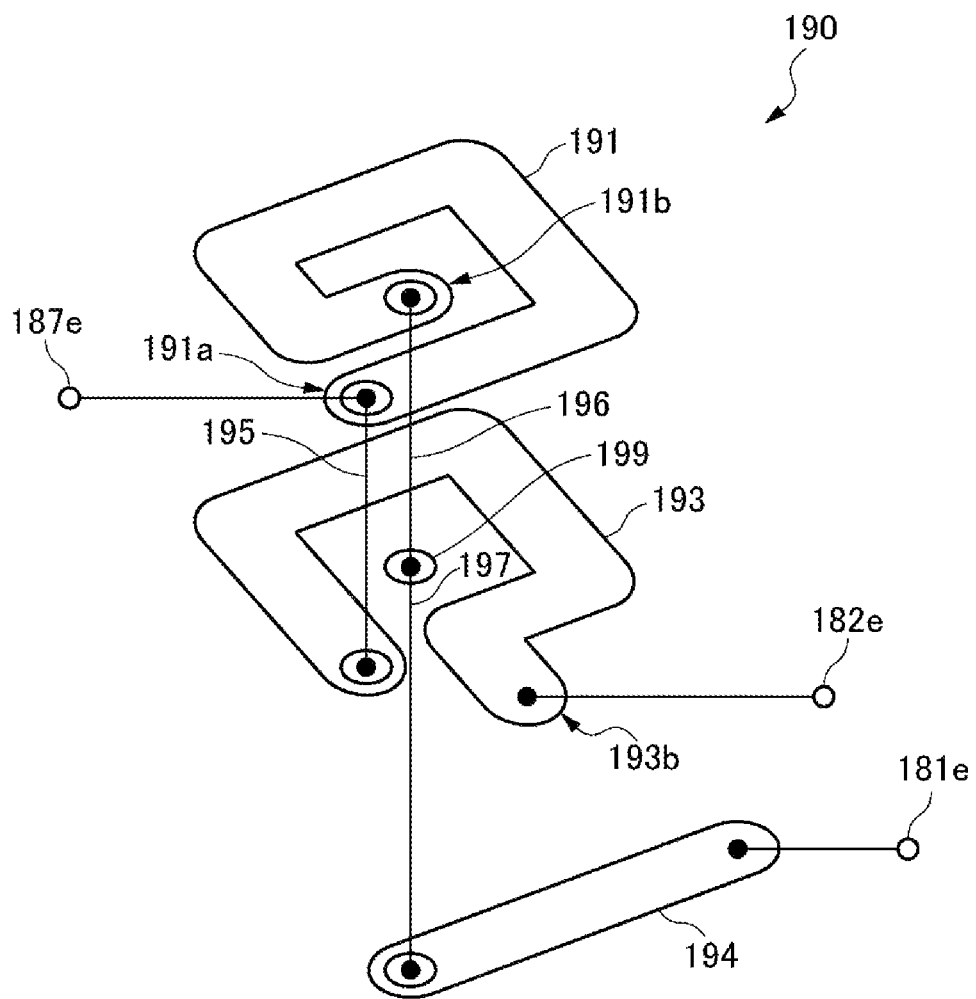
FIG. 3C is a perspective view schematically illustrating an example of the structure of the transmission line transformer.

As illustrated in FIG. 3B, in the transmission line transformer, the first to third transmission lines are disposed so as to be stacked in a thickness direction of a substrate. Specifically, the first end portion 191a of the first transmission line 191, the fifth end portion 193a of the third transmission line 193, and the fourth end portion 192b of the second transmission line 192 are disposed such that they overlay one another when viewed in plan. The second end portion 191b of the first transmission line 191 and the third end portion 192a of the second transmission line 192 are disposed such that they overlay each other when viewed in plan. In the same layer where the third transmission line 193 is disposed, a conductor pattern 199 is disposed at a position corresponding to the second end portion 191b of the first transmission line 191. A via conductor 195 connects the first end portion 191a of the first transmission line 191 and the fifth end portion 193a of the third transmission line 193. A via conductor 196 connects the second end portion 191b of the first transmission line 191 and the conductor pattern 199, and a via conductor 197 connects the conductor pattern 199 and the third end portion 192a of the second transmission line 192. A via conductor 198 connects the fourth end portion 192b of the second transmission line 192 and an extended line 194. The first end portion 191a of the first transmission line 191 is connected to the input terminal 190a, and the extended line 194 is connected to the output terminal 190b. The sixth end portion 193b of the third transmission line 193 is connected to a ground conductor GND.

As described above, the transmission line transformer 190 illustrated in FIGS. 3A and 3B has an impedance transformation ratio of 1:9, whereas, as illustrated in FIG. 3C, the transmission line transformer 190, for example, with a two-layer structure composed of the first transmission line 191 and the third transmission line 193 has an impedance transformation ratio of 1:4. Furthermore, in the transmission line transformer 190 illustrated in FIGS. 3A and 3B, an impedance transformation ratio of 1:2.25 is provided by connecting the first end portion 191a of the first transmission line 191 to the fifth end portion 193a of the third transmission line 193, connecting the sixth end portion 193b of the third transmission line 193 to the fourth end portion 192b of the second transmission line 192, and connecting the third end portion 192a of the second transmission line 192 to the ground conductor GND.

In the present embodiment, there will be described, as an example, the combiner 180 constructed by any combination of a transmission line transformer with an impedance transformation ratio of 1:9 (or 9:1), a transmission line transformer with a transformation ratio of 1:4 (or 4:1), and a transmission line transformer with a transformation ratio of 1:2.25 (or 2.25:1). Note that the combiner 180 is constructed by combining transmission line transformers with various transformation ratios. For example, the combiner 180 only has to be constructed so that an impedance at an input terminal is substantially equal to an impedance at an output terminal. For convenience of explanation, the following description will be given assuming that a portion corresponding to an end portion connected to the input terminal 190a in the transmission line transformer 190 is referred to as "one end" and a portion corresponding to an end portion connected to the output terminal 190b is referred to as "the other end".

First Form of Combiner 180a

Figure 4:
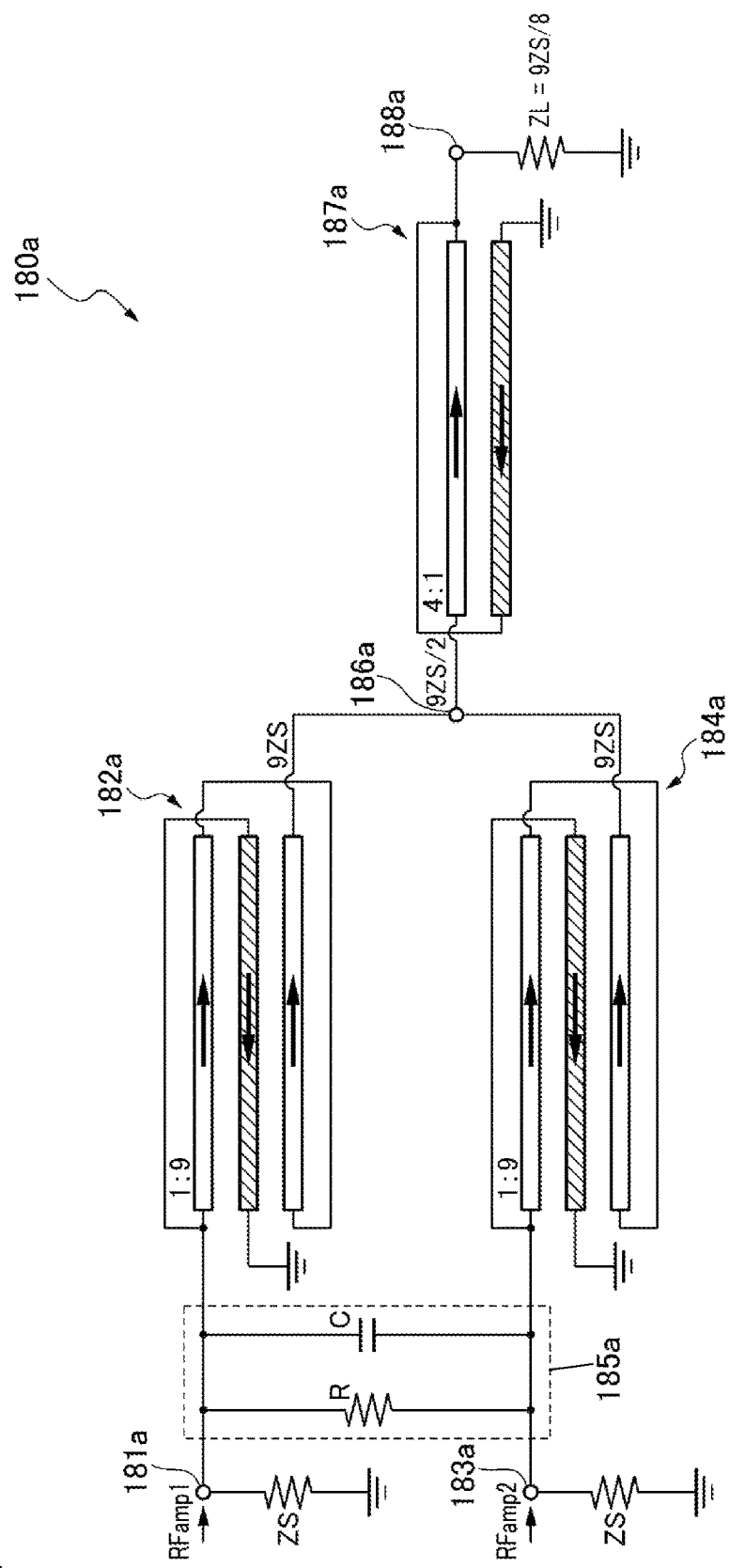
FIG. 4 illustrates an example of a configuration of a first form of combiner.

A first form of combiner 180a will be described with reference to FIG. 4. FIG. 4 illustrates an example of a configuration of the first form of combiner 180a.

As illustrated in FIG. 4, the combiner 180a includes, for example, a first input terminal 181a, a first transmission line transformer 182a, a second input terminal 183a, a second transmission line transformer 184a, a first isolation section 185a, a combination terminal 186a, a third transmission line transformer 187a, and an output terminal 188a.

The first input terminal 181a is a terminal to which an amplified signal RFamp1 is inputted. The first transmission line transformer 182a is, for example, a circuit that performs impedance transformation at a transformation ratio of 1:9. In the first transmission line transformer 182a, one end is connected to the first input terminal 181a, and the other end is connected to the combination terminal 186a. The second input terminal 183a is a terminal to which an amplified signal RFamp2 is inputted. The second transmission line transformer 184a is, for example, a circuit that performs impedance transformation at the same transformation ratio of 1:9 as that of the first transmission line transformer 182a. In the second transmission line transformer 184a, one end is connected to the second input terminal 183a, and the other end is connected to the combination terminal 186a. In other words, the first transmission line transformer 182a and the second transmission line transformer 184a are connected in parallel. The first isolation section 185a includes a resistor R and a capacitor C connected in parallel. The first isolation section 185a is connected between the first input terminal 181a and the second input terminal 183a. The combination terminal 186a is a terminal that combines the amplified signal RFamp1 inputted through the first transmission line transformer 182a and the amplified signal RFamp2 inputted through the second transmission line transformer 184a. The third transmission line transformer 187a is, for example, a circuit that performs impedance transformation at a transformation ratio of 4:1. In the third transmission line transformer 187a, one end is connected to the combination terminal 186a, and the other end is connected to the output terminal 188a. The output terminal 188a is connected to the path-changing switch 170.

Next, an overview of impedance transformation performed in the combiner 180a will be described. An impedance at the first input terminal 181a of the combiner 180a is ZS (50 ohms). In the first transmission line transformer 182a, ZS (50 ohms) is transformed into 9×ZS (450 ohms). The same things hold true for the second input terminal 183a and the second transmission line transformer 184a. Then, at the combination terminal 186a, an impedance of 9×ZS×½ (225 ohms) is reached and is transformed into a quarter in the third transmission line transformer 187a. Hence, an impedance (ZL) at the output terminal 188a is ZS×9/8 (about 50 ohms). Incidentally, in the third transmission line transformer 187a, the impedance may be finely adjusted.

Thus, in comparison with the power amplifier module 1000 according to the comparative example, the low-loss and wideband power amplifier module 100 can be implemented.

Second Form of Combiner 180b

Figure 5:
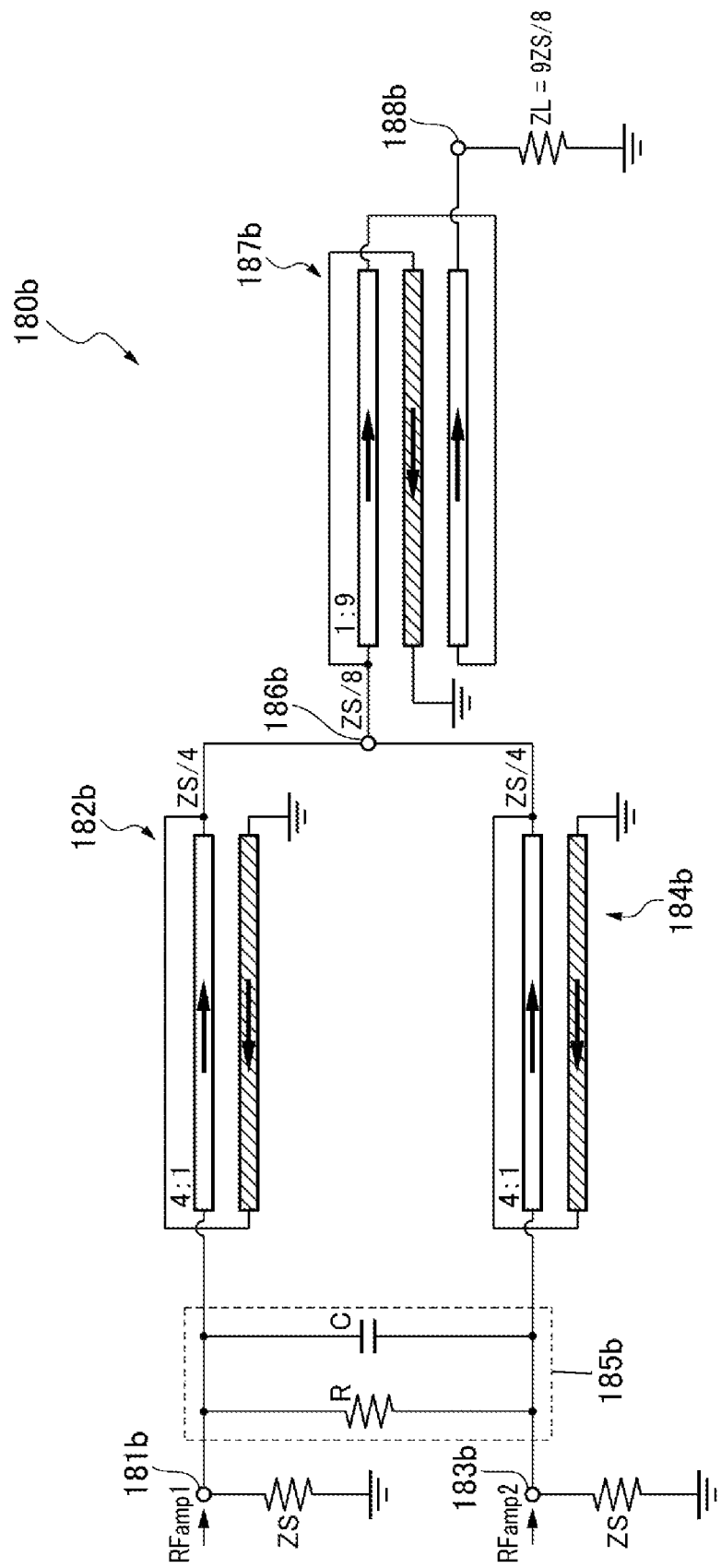
FIG. 5 illustrates an example of a configuration of a second form of combiner.

A second form of combiner 180b will be described with reference to FIG. 5. FIG. 5 illustrates an example of a configuration of the second form of combiner 180b.

As illustrated in FIG. 5, the combiner 180b includes, for example, a third input terminal 181b, a fourth transmission line transformer 182b, a fourth input terminal 183b, a fifth transmission line transformer 184b, a second isolation section 185b, a combination terminal 186b, a sixth transmission line transformer 187b, and an output terminal 188b.

The second form of combiner 180b is a combiner in which, in the first form of combiner 180a, the first and second transmission line transformers 182a and 184a with the transformation ratio of 1:9 are changed to the fourth and fifth transmission line transformers 182b and 184b with a transformation ratio of 4:1 and the third transmission line transformer 187a with the transformation ratio of 4:1 is changed to the sixth transmission line transformer 187b with a transformation ratio of 1:9. This enables low-loss and wideband power combination.

Third Form of Combiner 180c

Figure 6:
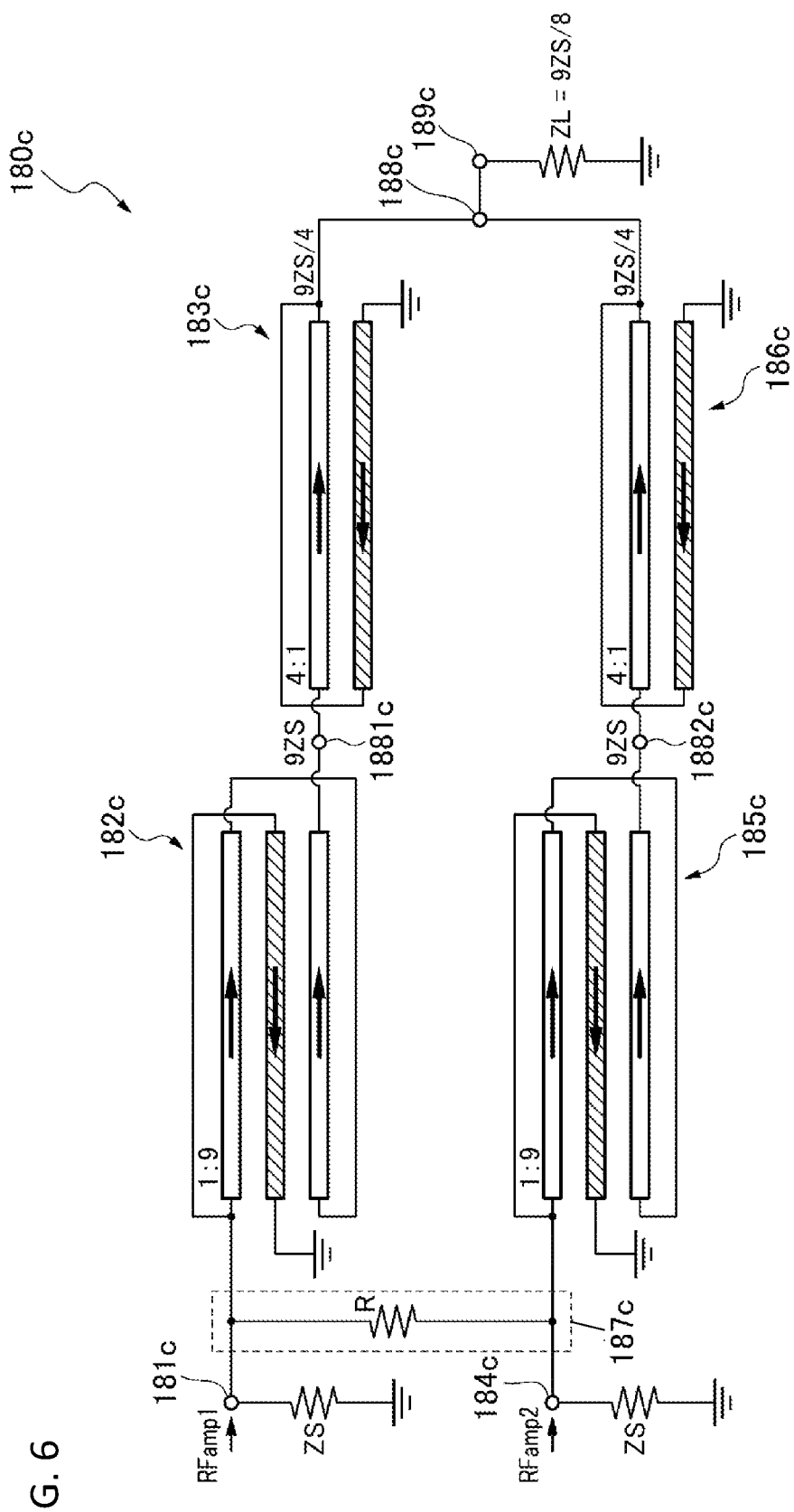
FIG. 6 illustrates an example of a configuration of a third form of combiner.

A third form of combiner 180c will be described with reference to FIG. 6. FIG. 6 illustrates an example of a configuration of the third form of combiner 180c.

As illustrated in FIG. 6, the combiner 180c includes, for example, a fifth input terminal 181c, a seventh transmission line transformer 182c, an eighth transmission line transformer 183c, a sixth input terminal 184c, a ninth transmission line transformer 185c, a tenth transmission line transformer 186c, a third isolation section 187c, a combination terminal 188c, a first connection terminal 1881c, a second connection terminal 1882c, and an output terminal 189c.

The fifth input terminal 181c is a terminal to which an amplified signal RFamp1 is inputted. The seventh transmission line transformer 182c is, for example, a circuit that performs impedance transformation at a transformation ratio of 1:9. In the seventh transmission line transformer 182c, one end is connected to the fifth input terminal 181c, and the other end is connected to one end of the eighth transmission line transformer 183c through the first connection terminal 1881c. The eighth transmission line transformer 183c is, for example, a circuit that performs impedance transformation at a transformation ratio of 4:1. In the eighth transmission line transformer 183c, the other end is connected to the combination terminal 188c. The sixth input terminal 184c is a terminal to which an amplified signal RFamp2 is inputted. The ninth transmission line transformer 185c is, for example, a circuit that performs impedance transformation at the same transformation ratio of 1:9 as that of the seventh transmission line transformer 182c. In the ninth transmission line transformer 185c, one end is connected to the sixth input terminal 184c, and the other end is connected to one end of the tenth transmission line transformer 186c through the second connection terminal 1882c. The tenth transmission line transformer 186c is, for example, a circuit that performs impedance transformation at the same transformation ratio of 4:1 as that of the eighth transmission line transformer 183c. In the tenth transmission line transformer 186c, the other end is connected to the combination terminal 188c. In other words, the seventh transmission line transformer 182c and the eighth transmission line transformer 183c are connected in parallel with the ninth transmission line transformer 185c and the tenth transmission line transformer 186c. The third isolation section 187c is connected between the fifth input terminal 181c and the sixth input terminal 184c. The third isolation section 187c is, for example, a resistor having a resistance value based on a power distribution ratio between a transmission line connected to the fifth input terminal 181c and a transmission line connected to the sixth input terminal 184c. The combination terminal 188c is a terminal that combines the amplified signal RFamp1 inputted through the seventh transmission line transformer 182c and the eighth transmission line transformer 183c and the amplified signal RFamp2 inputted through the ninth transmission line transformer 185c and the tenth transmission line transformer 186c. The output terminal 189c is connected to the combination terminal 188c. The output terminal 189c is connected to the path-changing switch 170.

Next, an overview of impedance transformation performed in the combiner 180c will be described. An impedance at the fifth input terminal 181c of the combiner 180c is ZS (50 ohms). In the seventh transmission line transformer 182c, ZS (50 ohms) is transformed into 9×ZS (450 ohms). Then, 9×ZS (450 ohms) is transformed into ZS×9/4 (112 ohms) in the eighth transmission line transformer 183c. The same things hold true for the sixth input terminal 184c, the ninth transmission line transformer 185c, and the tenth transmission line transformer 186c. Then, at the combination terminal 188c, ZS×9/4 (112 ohms) is reduced by half. Hence, an impedance at the output terminal 189c is ZS×9/8 (about 50 ohms). Incidentally, in the eighth transmission line transformer 183c and the tenth transmission line transformer 186c, impedances may be finely adjusted.

Thus, in comparison with the power amplifier module 1000 according to the comparative example, the low-loss and wideband power amplifier module 100 can be implemented.

Fourth Form of Combiner 180d

Figure 7:
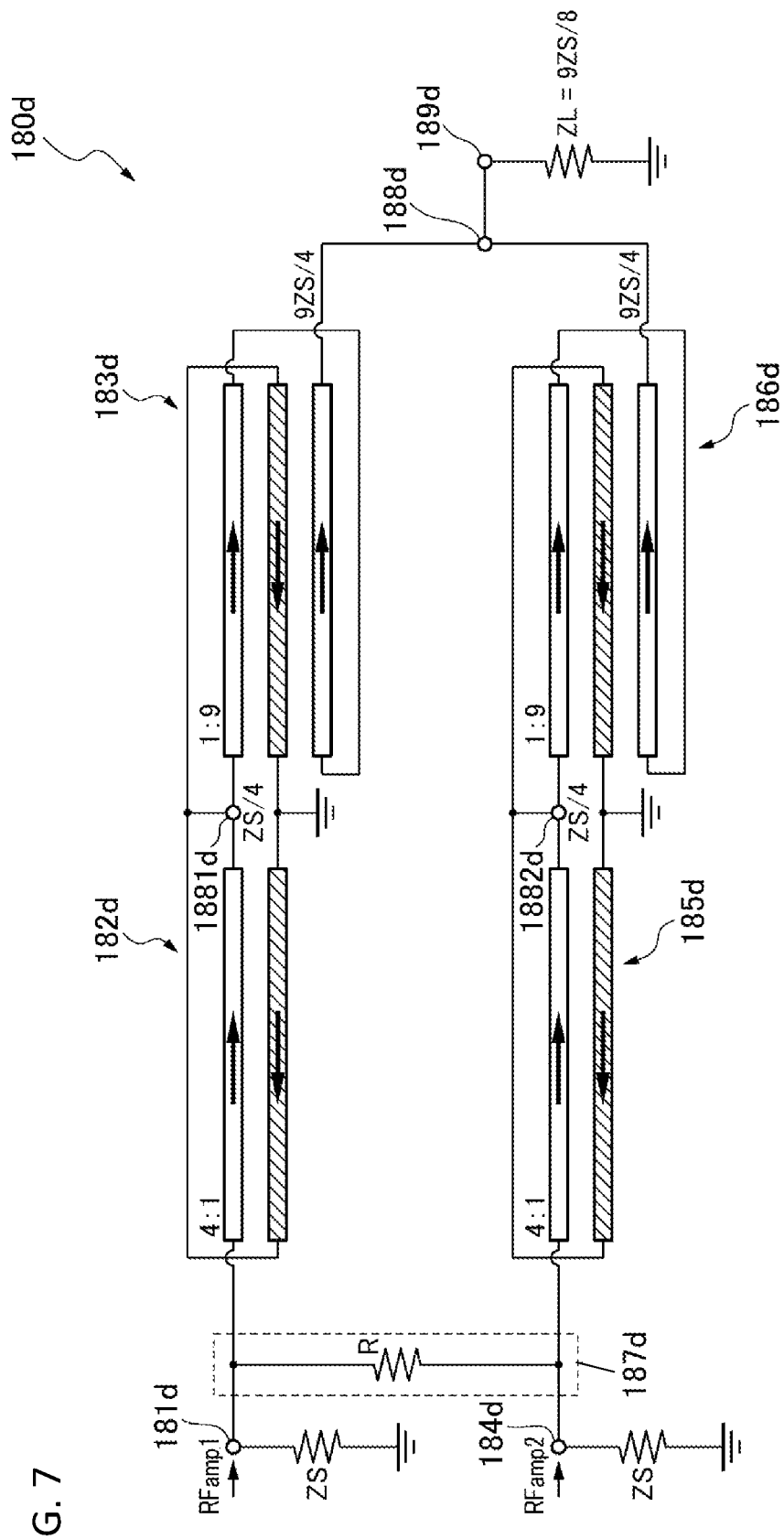
FIG. 7 illustrates an example of a configuration of a fourth form of combiner.

A fourth form of combiner 180d will be described with reference to FIG. 7. FIG. 7 illustrates an example of a configuration of the fourth form of combiner 180d.

As illustrated in FIG. 7, the fourth form of combiner 180d includes, for example, a seventh input terminal 181d, an eleventh transmission line transformer 182d, a twelfth transmission line transformer 183d, an eighth input terminal 184d, a thirteenth transmission line transformer 185d, a fourteenth transmission line transformer 186d, a fourth isolation section 187d, a combination terminal 188d, and an output terminal 189d. The fourth form of combiner 180d is a combiner in which, in the third form of combiner 180c, the seventh and ninth transmission line transformers 182c and 185c with the transformation ratio of 1:9 are changed to the eleventh and thirteenth transmission line transformers 182d and 185d with a transformation ratio of 4:1 and the eighth and tenth transmission line transformers 183c and 186c with the transformation ratio of 4:1 are changed to the twelfth and fourteenth transmission line transformers 183d and 186d with a transformation ratio of 1:9. This enables low-loss and wideband power combination.

Fifth Form of Combiner 180e

Figure 8:
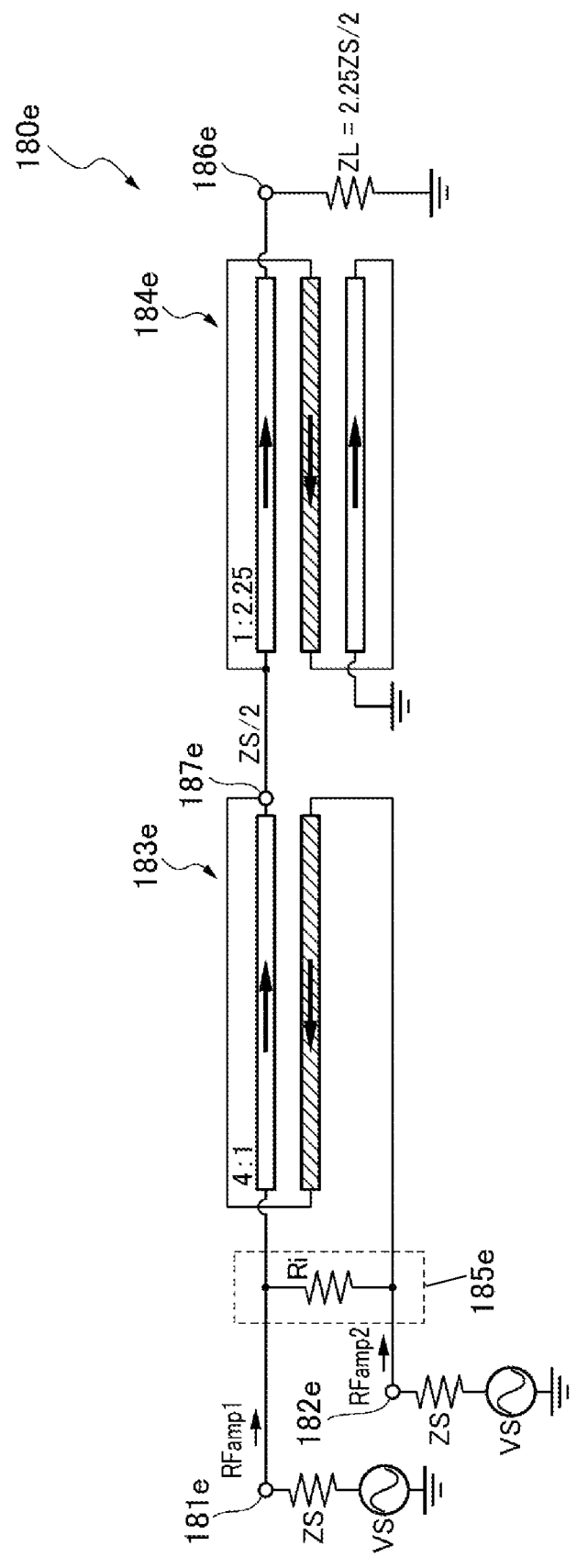
FIG. 8 illustrates an example of a configuration of a fifth form of combiner.

A fifth form of combiner 180e will be described with reference to FIG. 8. FIG. 8 illustrates an example of a configuration of the fifth form of combiner 180e.

As illustrated in FIG. 8, the combiner 180e includes, for example, a ninth input terminal 181e, a tenth input terminal 182e, a fifteenth transmission line transformer 183e, a sixteenth transmission line transformer 184e, a fifth isolation section 185e, an output terminal 186e, and a combination terminal 187e.

The ninth input terminal 181e is a terminal to which an amplified signal RFamp1 is inputted. The tenth input terminal 182e is a terminal to which an amplified signal RFamp2 is inputted. The fifteenth transmission line transformer 183e is, for example, a circuit that performs impedance transformation at a transformation ratio of 4:1. In the fifteenth transmission line transformer 183e, for example, the ninth input terminal 181e is connected to the second end portion 191b of the first transmission line 191 of the transmission line transformer 190 illustrated in FIG. 3C, the tenth input terminal 182e is connected to the sixth end portion 193b (second end portion) of the third transmission line 193, and the combination terminal 187e is connected to the first end portion 191a of the first transmission line 191. Here, although FIG. 3C illustrates the transmission line transformer 190 including the extended line 194, the transmission line transformer 190 does not have to include the extended line 194. In this case, the second end portion 191b of the first transmission line 191 is constructed so as to extend toward the outside of the first transmission line 191, and the ninth input terminal 181e may be provided at the extended second end portion 191b. In the fifteenth transmission line transformer 183e, the other end is connected to one end of the sixteenth transmission line transformer 184e through the combination terminal 187e. The sixteenth transmission line transformer 184e is, for example, a circuit that performs impedance transformation at a transformation ratio of 1:2.25. In the sixteenth transmission line transformer 184e, the one end is connected to the other end of the fifteenth transmission line transformer 183e, and the other end is connected to the output terminal 186e. The output terminal 186e is connected to the path-changing switch 170.

Next, an overview of impedance transformation performed in the combiner 180e will be described. Each of impedances at the ninth and tenth input terminals 181e and 182e of the combiner 180e is ZS (50 ohms). Here, the fifteenth transmission line transformer 183e performs an operation of transforming the sum of impedances connected between the ninth input terminal 181e and the tenth input terminal 182e into a quarter. When powers in phase are inputted to the respective ninth and tenth input terminals 181e and 182e of the combiner 180e, an impedance between the ninth input terminal 181e and the tenth input terminal 182e can be regarded as a configuration in which two Zss are connected in series through a common terminal (ground) and is thus 100 ohms from 2×ZS. In the fifteenth transmission line transformer 183e, 2×ZS (100 ohms) is transformed into 2×ZS×¼ (25 ohms), and 25 ohms is reached at the combination terminal 187e (combination terminal). Then, 25 ohms is transformed into ZS/2×2.25 in the sixteenth transmission line transformer 184e, and an impedance at the output terminal 186e is ZS/2×2.25 (about 50 ohms). Incidentally, in the sixteenth transmission line transformer 184e, the impedance may be finely adjusted.

Thus, in comparison with the power amplifier module 1000 according to the comparative example, the low-loss and wideband power amplifier module 100 can be implemented.

Other Embodiments

Figure 9A:
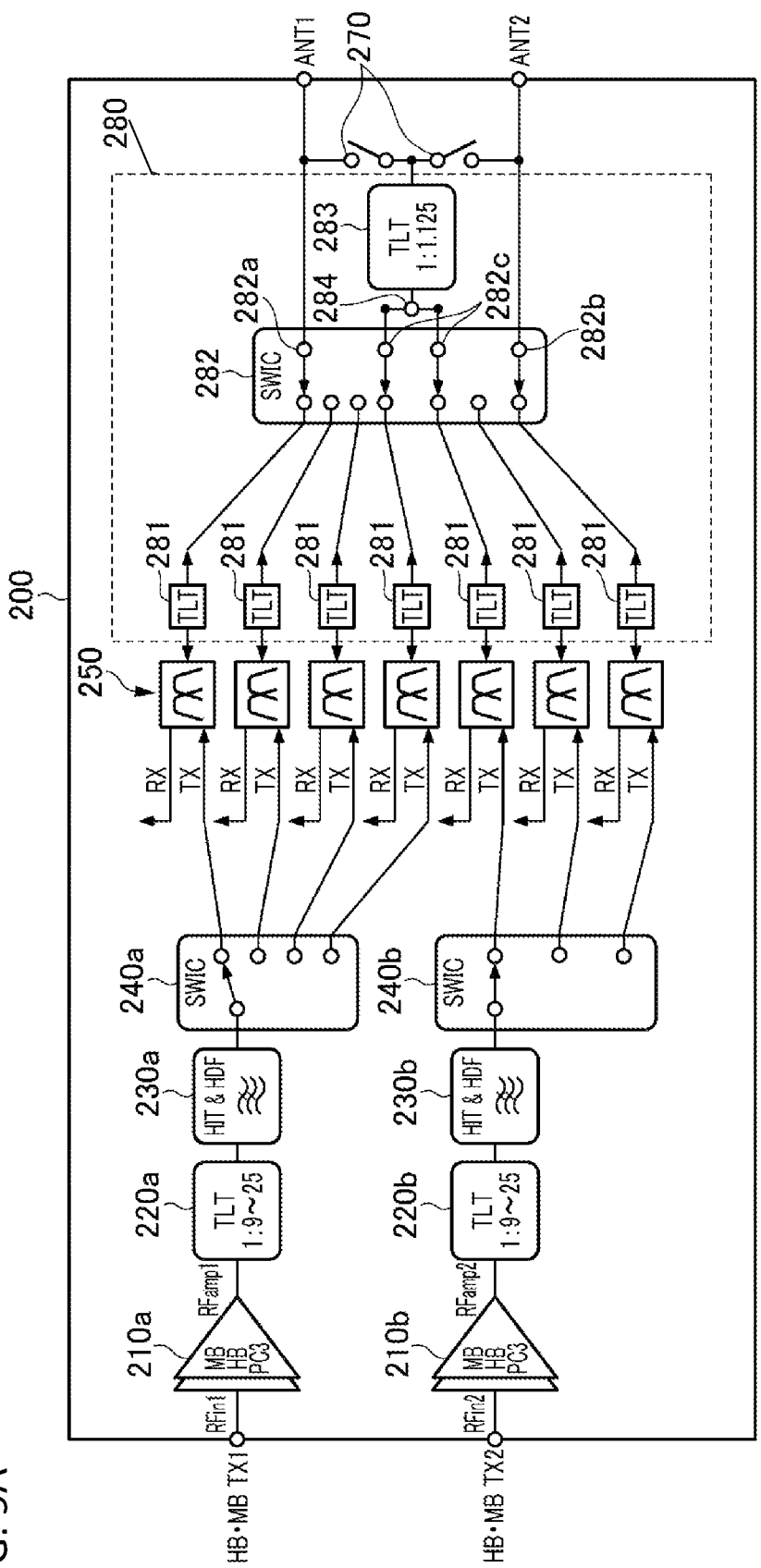
FIG. 9A illustrates an overview of a configuration of a power amplifier module according to another embodiment.
Figure 9B:
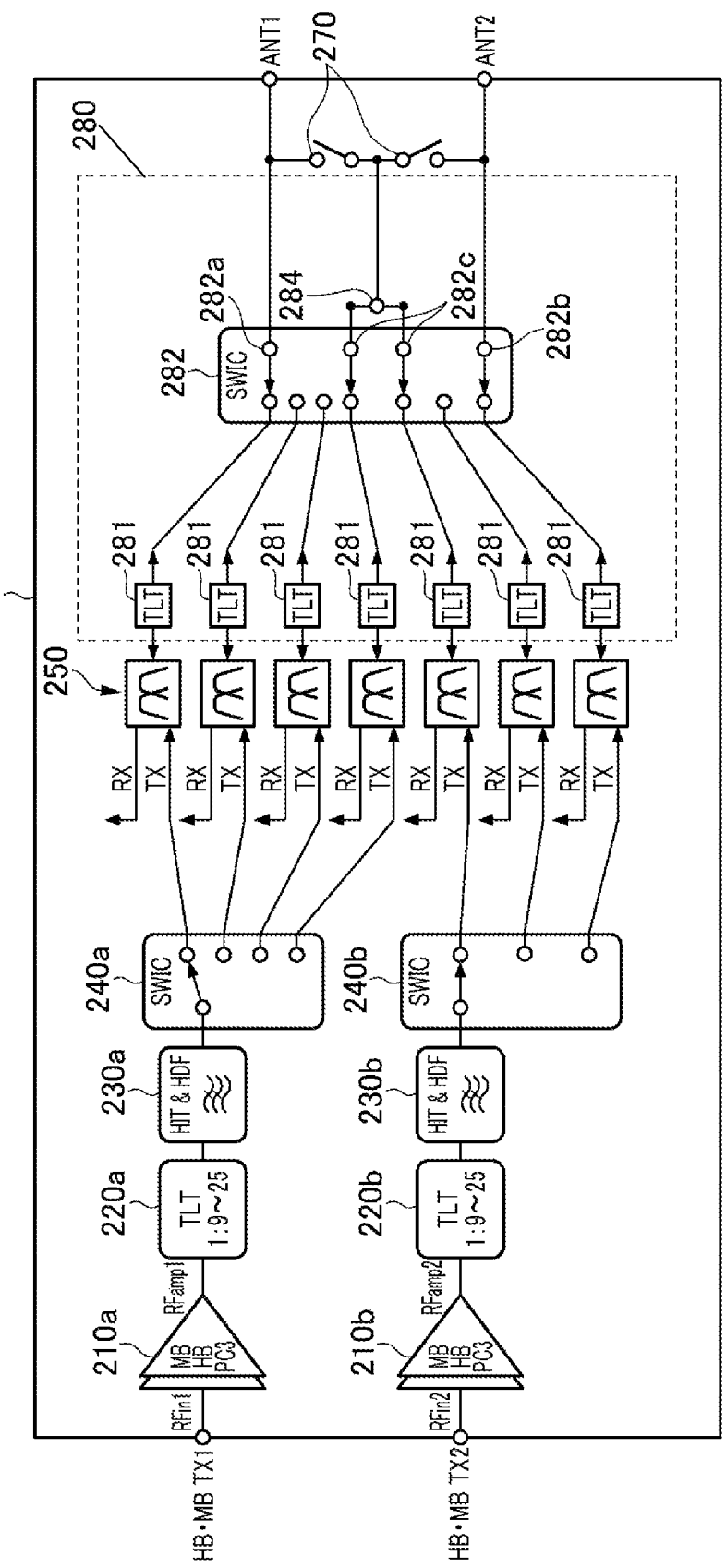
FIG. 9B illustrates an overview of a configuration of the power amplifier module according to the other embodiment.

A power amplifier module 200 according to another embodiment will be described with reference to FIGS. 9A and 9B. FIGS. 9A and 9B illustrate an overview of a configuration of the power amplifier module 200 according to the other embodiment.

The power amplifier module 200 according to the other embodiment includes a combiner 280 including the antenna switch 160 of the power amplifier module 100 illustrated in FIG. 1. Other components are similar to those of the power amplifier module 100, and thus a description thereof is omitted.

FIG. 9A illustrates the power amplifier module 200 including a transmission line transformer between an antenna switch 282 and the antennas ANT1 and ANT2. As illustrated in FIG. 9A, the combiner 280 includes, for example, preceding transmission line transformers 281, the antenna switch 282, a subsequent transmission line transformer 283, and a combination terminal 284.

The preceding transmission line transformers 281 are connected to antennas ANT1 and ANT2 sides of duplexers 250. Each of the preceding transmission line transformers 281 performs impedance transformation at a predetermined transformation ratio. Specifically, the preceding transmission line transformers 281 correspond to, for example, in the power amplifier module 100, the first and second transmission line transformers 182*a* and 184*a* in the combiner 180*a*, or the fourth and fifth transmission line transformers 182*b* and 184*b* in the combiner 180*b*.

Although the input terminals of the antenna switch 160 illustrated in FIG. 2 are connected to the duplexers 150, input terminals of the antenna switch 282 are connected, for example, to the preceding transmission line transformers 281 in place of the duplexers 150. The structure of the antenna switch 282 is similar to the structure of the antenna switch 160 illustrated in FIG. 2, and thus a description thereof is omitted. In comparison with a combination terminal provided in the combiner 180 of the power amplifier module 100, in the power amplifier module 200 according to the other embodiment, the combination terminal 284 is provided, for example, between the antenna switch 282 and the subsequent transmission line transformer 283.

The subsequent transmission line transformer 283 is connected to an antennas ANT1 and ANT2 side of the antenna switch 282. The subsequent transmission line transformer 283 performs impedance transformation at a predetermined transformation ratio. Specifically, the subsequent transmission line transformer 283 corresponds to, in the power amplifier module 100, the third transmission line transformer 187*a* in the combiner 180*a*, or the sixth transmission line transformer 187*b* in the combiner 180*b*.

Thus, in comparison with the power amplifier module 1000 according to the comparative example, the power amplifier module 200 can be reduced in size.

FIG. 9B illustrates the power amplifier module 200 including no transmission line transformer between the antenna switch 282 and the antennas ANT1 and ANT2. As illustrated in FIG. 9B, the combiner 280 includes, for example, the preceding transmission line transformers 281, the antenna switch 282, and the combination terminal 284. The preceding transmission line transformers 281 are connected to the antennas ANT1 and ANT2 sides of the duplexers 250. Each of the preceding transmission line transformers 281 performs impedance transformation at a predetermined transformation ratio. Specifically, the preceding transmission line transformers 281 correspond to, for example, in the power amplifier module 100, the seventh and eighth transmission line transformers 182*c* and 183*c* and the ninth and tenth transmission line transformers 185*c* and 186*c* in the combiner 180*c*, or the eleventh and twelfth transmission line transformers 182*d* and 183*d* and the thirteenth and fourteenth transmission line transformers 185*d* and 186*d* in the combiner 180*d*. The antenna switch 282 is described above, and thus a description thereof is omitted. The combination terminal 284 is connected, for example, to a path-changing switch 270. The path-changing switch 270 is similar to the path-changing switch 170, and thus a description thereof is omitted. Thus, in comparison with the power amplifier module 1000 according to the comparative example, the power amplifier module 200 can be reduced in size.

Summary

The power amplifier module 100 according to the present embodiment includes the first amplifier 110*a* that amplifies a power level of an input signal RFin1 (first input signal) in a predetermined frequency band and outputs an amplified signal RFamp1 (first signal) of PC3 (first power level); the first impedance transformer 120*a* connected to the first amplifier 110*a* and including a transmission line transformer; the second amplifier 110*b* that amplifies a power level of an input signal RFin2 (second input signal) in the predetermined frequency band and outputs an amplified signal RFamp2 (second signal) of PC3 (first power level); the second impedance transformer 120*b* connected to the second amplifier 110*b* and including a transmission line transformer; and the combiner 180 that combines the amplified signal RFamp1 (first signal) inputted through the first impedance transformer 120*a* and the amplified signal RFamp2 (second signal) inputted through the second impedance transformer 120*b* into an output signal of PC2 (second power level) larger than PC3 (first power level) and includes a transmission line transformer. This enables an increase in transmission efficiency while achieving a reduction in module size.

Furthermore, the power amplifier module 100 according to the present embodiment further includes the antenna switch 160. The antenna switch 160 includes one terminal (first terminal) of input terminals 161 to which the amplified signal RFamp1 (first signal) is inputted through the first impedance transformer 120*a*, one terminal (second terminal) of input terminals 161 to which the amplified signal RFamp2 (second signal) is inputted through the second impedance transformer 120*b*, the first output terminal 162*a* that outputs the amplified signal RFamp1 (first signal) to the antenna ANT1 (first antenna), the second output terminal 162*b* that outputs the amplified signal RFamp2 (second signal) to the antenna ANT2 (second antenna) different from the antenna ANT1 (first antenna), and the third output terminals 162*c* that output the amplified signal RFamp1 (first signal) and the amplified signal RFAmp2 (second signal) to the combiner 180. This enables an increase in transmission efficiency while achieving a reduction in module size. Furthermore, the combiner 180 is disposed on the antennas ANT1 and ANT2 side of the antenna switch 160, and thus the impedances at the input and output terminals of the antenna switch 160 are about 50 ohms, therefore making it possible to reduce power loss due to a resistance component of the antenna switch 160.

Furthermore, the first form of combiner 180*a* (combiner) in the power amplifier module 100 according to the present embodiment includes the combination terminal 186*a* at which the amplified signal RFamp1 (first signal) and the amplified signal RFamp2 (second signal) are combined, the first transmission line transformer 182*a* that is connected between the combination terminal 186*a* and the first input terminal 181*a* to which the amplified signal RFamp1 (first signal) is inputted and that performs impedance transformation at a transformation ratio of 1:9 (first transformation ratio) so that an impedance increases, the second transmission line transformer 184*a* that is connected between the combination terminal 186*a* and the second input terminal 183*a* to which the amplified signal RFamp2 (second signal) is inputted and that performs impedance transformation at the transformation ratio of 1:9 (first transformation ratio) so that an impedance increases, the third transmission line transformer 187*a* that is connected between the combination terminal 186*a* and the output terminal 188*a* and that performs impedance transformation at a transformation ratio of 4:1 (second transformation ratio) so that an impedance decreases, and the first isolation section 185*a* connected between the first input terminal 181*a* and the second input terminal 183*a*. Thus, the low-loss and wideband power amplifier module 100 can be implemented.

Furthermore, the second form of combiner 180*b* (combiner) in the power amplifier module 100 according to the present embodiment includes the combination terminal 186*b* at which the amplified signal RFamp1 (first signal) and the amplified signal RFamp2 (second signal) are combined, the fourth transmission line transformer 182*b* that is connected between the combination terminal 186*b* and the third input terminal 181*b* to which the amplified signal RFamp1 (first signal) is inputted and that performs impedance transformation at a transformation ratio of 4:1 (third transformation ratio) so that an impedance decreases, the fifth transmission line transformer 184*b* that is connected between the combination terminal 186*b* and the fourth input terminal 183*b* to which the amplified signal RFamp2 (second signal) is inputted and that performs impedance transformation at the transformation ratio of 4:1 (third transformation ratio) so that an impedance decreases, the sixth transmission line transformer 187*b* that is connected between the combination terminal 186*b* and the output terminal 188*b* and that performs impedance transformation at a transformation ratio of 1:9 (fourth transformation ratio) so that an impedance increases, and the second isolation section 185*b* connected between the third input terminal 181*b* and the fourth input terminal 183*b*. Thus, the low-loss and wideband power amplifier module 100 can be implemented.

Furthermore, the third form of combiner 180*c* (combiner) in the power amplifier module 100 according to the present embodiment includes the combination terminal 188*c* at which the amplified signal RFamp1 (first signal) and the amplified signal RFamp2 (second signal) are combined, the seventh transmission line transformer 182*c* that performs impedance transformation at a transformation ratio of 1:9 (fifth transformation ratio) so that an impedance increases, the eighth transmission line transformer 183*c* that is connected in series with the seventh transmission line transformer 182*c* through the first connection terminal 1881*c* and that performs impedance transformation at a transformation ratio of 4:1 (sixth transformation ratio) so that the impedance decreases, the ninth transmission line transformer 185*c* that performs impedance transformation at the transformation ratio of 1:9 (fifth transformation ratio) so that an impedance increases, the tenth transmission line transformer 186*c* that is connected in series with the ninth transmission line transformer 185*c* through the second connection terminal 1882*c* and that performs impedance transformation at the transformation ratio of 4:1 (sixth transformation ratio) so that the impedance decreases, and the third isolation section 187*c*. The seventh transmission line transformer 182*c* is connected between the first connection terminal 1881*c* and the fifth input terminal 181*c* to which the amplified signal RFamp1 (first signal) is inputted. The eighth transmission line transformer 183*c* is connected between the first connection terminal 1881*c* and the combination terminal 188*c*. The ninth transmission line transformer 185*c* is connected between the second connection terminal 1882*c* and the sixth input terminal 184*c* to which the amplified signal RFamp2 (second signal) is inputted. The tenth transmission line transformer 186*c* is connected between the second connection terminal 1882*c* and the combination terminal 188*c*. The third isolation section 187*c* is connected between the fifth input terminal 181*c* and the sixth input terminal 184*c*. Thus, the low-loss and wideband power amplifier module 100 can be implemented.

Furthermore, the fourth form of combiner 180*d* (combiner) in the power amplifier module 100 according to the present embodiment includes the combination terminal 188*d* at which the amplified signal RFamp1 (first signal) and the amplified signal RFamp2 (second signal) are combined, the eleventh transmission line transformer 182*d* that performs impedance transformation at a transformation ratio of 4:1 (seventh transformation ratio) so that an impedance decreases, the twelfth transmission line transformer 183*d* that is connected in series with the eleventh transmission line transformer 182*d* through a third connection terminal 1881*d* and that performs impedance transformation at a transformation ratio of 1:9 (eighth transformation ratio) so that the impedance increases, the thirteenth transmission line transformer 185*d* that performs impedance transformation at the transformation ratio of 4:1 (seventh transformation ratio) so that an impedance decreases, the fourteenth transmission line transformer 186*d* that is connected in series with the thirteenth transmission line transformer 185*d* through a fourth connection terminal 1882*d* and that performs impedance transformation at the transformation ratio of 1:9 (eighth transformation ratio) so that the impedance increases, and the fourth isolation section 187*d*. The eleventh transmission line transformer 182*d* is connected between the third connection terminal 1881*d* and the seventh input terminal 181*d* to which the amplified signal RFamp1 (first signal) is inputted. The twelfth transmission line transformer 183*d* is connected between the third connection terminal 1881*d* and the combination terminal 188*d*. The thirteenth transmission line transformer 185*d* is connected between the fourth connection terminal 1882*d* and the eighth input terminal 184*d* to which the amplified signal RFamp2 (second signal) is inputted. The fourteenth transmission line transformer 186*d* is connected between the fourth connection terminal 1882*d* and the combination terminal 188*d*. The fourth isolation section 187*d* is connected between the seventh input terminal 181*d* and the eighth input terminal 184*d*. Thus, the low-loss and wideband power amplifier module 100 can be implemented.

Furthermore, the fifth form of combiner 180*e* (combiner) in the power amplifier module 100 according to the present embodiment includes the combination terminal 187*e* at which the amplified signal RFamp1 (first signal) and the amplified signal RFamp2 (second signal) are combined, the fifteenth transmission line transformer 183*e* that includes the second end portion 191*b* (first end portion) that is connected to the ninth input terminal 181*e* and to which the amplified signal RFamp1 (first signal) is inputted, the sixth end portion 193*b* (second end portion) that is connected to the tenth input terminal 182*e* and to which the amplified signal RFamp2 (second signal) is inputted, and the first end portion 191*a* (third end portion) connected to the combination terminal 187*e*, and that performs impedance transformation at a transformation ratio of 4:1 (ninth transformation ratio) so that an impedance decreases, the sixteenth transmission line transformer 184*e* that is connected in series with the fifteenth transmission line transformer 183*e* through the combination terminal 187*e* and connected between the combination terminal 187*e* and the output terminal 186*e*, and that performs impedance transformation at a transformation ratio of 1:2.25 (tenth transformation ratio) so that the impedance increases, and the fifth isolation section 185*e* connected between the ninth input terminal 181*e* and the tenth input terminal 182*e*. Thus, the low-loss and wideband power amplifier module 100 can be implemented.

Furthermore, the combiner 280 of the power amplifier module 200 according to the present embodiment includes a preceding transmission line transformer 281 (seventeenth transmission line transformer) that is connected to a duplexer 150 (first duplexer) separating a reception signal and the amplified signal RFamp1 (first signal) and that performs impedance transformation at a predetermined transformation ratio (eleventh transformation ratio), a preceding transmission line transformer 281 (eighteenth transmission line transformer) that is connected to a duplexer 150 (second duplexer) separating a reception signal and the amplified signal RFamp2 (second signal) and that performs impedance transformation at the predetermined transformation ratio (eleventh transformation ratio), and the antenna switch 282 including an input terminal (eleventh input terminal) to which the amplified signal RFamp1 (first signal) is inputted through the preceding transmission line transformer 281 (seventeenth transmission line transformer), an input terminal (twelfth input terminal) to which the amplified signal RFamp2 (second signal) is inputted through the preceding transmission line transformer 281 (eighteenth transmission line transformer), a fourth output terminal connected to the antenna ANT1 (first antenna), an output terminal (fifth output terminal) connected to the antenna ANT2 (second antenna) different from the antenna ANT1 (first antenna), and output terminals (sixth output terminals) connected to the combination terminal 284 at which the amplified signal RFamp1 (first signal) and the amplified signal RFamp2 (second signal) are combined. Thus, the power amplifier module 200 is reduced in size.

Furthermore, the combiner 280 of the power amplifier module 200 according to the present embodiment includes the subsequent transmission line transformer 283 (nineteenth transmission line transformer) that is connected between the combination terminal 284 and an output terminal (for example, a terminal connected to the path-changing switch 270) and that performs impedance transformation at a predetermined transformation ratio (twelfth transformation ratio). Thus, the power amplifier module 200 can be reduced in size.

Furthermore, the combiner 180 or 280 in the power amplifier module 100 or 200 according to the present embodiment receives input of the amplified signal RFamp1 (first signal) and the amplified signal RFamp2 (second signal) through the first and second band selection switches 140a and 140b that distribute the amplified signal RFamp1 (first signal) and the amplified signal RFamp2 (second signal) in accordance with the predetermined frequency band. Thus, a module used in a wide band can be implemented.

Furthermore, the combiner 180 in the power amplifier module 100 according to the present embodiment receives input of the amplified signal RFamp1 (first signal) and the amplified signal RFamp2 (second signal) through duplexers 150 that distribute the amplified signal RFamp1 (first signal) and the amplified signal RFamp2 (second signal), and a reception signal received. This enables transmission and reception using the same antenna, thus achieving a reduction in module size.

Furthermore, the predetermined frequency band of each input signal RFin in the power amplifier module 100 or 200 according to the present embodiment is a frequency band from 1710 MHz to 2690 MHz. When the first amplifier 110a and the second amplifier 110b that support a wide band are used, the number of components can be reduced, thus achieving a reduction in module size.

The above-described embodiments are intended to facilitate understanding of the present disclosure but are not intended for a limited interpretation of the present disclosure. The present disclosure can be changed or improved without departing from the gist thereof and also encompasses equivalents thereof. In other words, appropriate design changes made to the embodiments by those skilled in the art are also encompassed in the scope of the present disclosure as long as the changes have features of the present disclosure. The elements included in the embodiments, and the arrangement and so forth of the elements are not necessarily limited to those exemplified herein and can be appropriately changed. While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. A power amplifier module comprising:
a first amplifier configured to amplify a power level of a first input signal in a predetermined frequency band and output a first signal of a first power level;
a first impedance transformer connected to the first amplifier and including a transmission line transformer;
a second amplifier configured to amplify a power level of a second input signal in the predetermined frequency band and output a second signal of the first power level;
a second impedance transformer connected to the second amplifier and including a transmission line transformer;
a combiner configured to combine the first signal inputted through the first impedance transformer and the second signal inputted through the second impedance transformer into an output signal of a second power level larger than the first power level, the combiner including a transmission line transformer; and
an antenna switch,
wherein the antenna switch includes:
a first terminal to which the first signal is inputted through the first impedance transformer,
a second terminal to which the second signal is inputted through the second impedance transformer,
a first output terminal configured to output the first signal to a first antenna,
a second output terminal configured to output the second signal to a second antenna different from the first antenna, and
third output terminals configured to output the first signal and the second signal to the combiner.

2. A power amplifier module comprising:
a first amplifier configured to amplify a power level of a first input signal in a predetermined frequency band and output a first signal of a first power level;
a first impedance transformer connected to the first amplifier and including a transmission line transformer;
a second amplifier configured to amplify a power level of a second input signal in the predetermined frequency band and output a second signal of the first power level;
a second impedance transformer connected to the second amplifier and including a transmission line transformer; and
a combiner configured to combine the first signal inputted through the first impedance transformer and the second signal inputted through the second impedance transformer into an output signal of a second power level larger than the first power level, the combiner including a transmission line transformer,
wherein the combiner includes:
a combination terminal at which the first signal and the second signal are combined,
a first transmission line transformer connected between the combination terminal and a first input terminal to which the first signal is inputted and configured to perform impedance transformation at a first transformation ratio so that an impedance increases, a second transmission line transformer connected between the combination terminal and a second input terminal to which the second signal is inputted and configured to perform impedance transformation at the first transformation ratio so that an impedance increases, a third transmission line transformer connected between the combination terminal and an output terminal and configured to perform impedance transformation at a second transformation ratio so that an impedance decreases, and a first isolation section connected between the first input terminal and the second input terminal.

3. The power amplifier module according to claim 1, wherein the combiner includes:

a combination terminal at which the first signal and the second signal are combined, a first transmission line transformer connected between the combination terminal and a first input terminal to which the first signal is inputted and configured to perform impedance transformation at a first transformation ratio so that an impedance increases, a second transmission line transformer connected between the combination terminal and a second input terminal to which the second signal is inputted and configured to perform impedance transformation at the first transformation ratio so that an impedance increases, a third transmission line transformer connected between the combination terminal and an output terminal and configured to perform impedance transformation at a second transformation ratio so that an impedance decreases, and a first isolation section connected between the first input terminal and the second input terminal.

4. A power amplifier module comprising:

a first amplifier configured to amplify a power level of a first input signal in a predetermined frequency band and output a first signal of a first power level;

a first impedance transformer connected to the first amplifier and including a transmission line transformer;

a second amplifier configured to amplify a power level of a second input signal in the predetermined frequency band and output a second signal of the first power level;

a second impedance transformer connected to the second amplifier and including a transmission line transformer; and a combiner configured to combine the first signal inputted through the first impedance transformer and the second signal inputted through the second impedance transformer into an output signal of a second power level larger than the first power level, the combiner including a transmission line transformer, wherein the combiner includes:

a combination terminal at which the first signal and the second signal are combined, a fourth transmission line transformer connected between the combination terminal and a third input terminal to which the first signal is inputted and configured to perform impedance transformation at a third transformation ratio so that an impedance decreases, a fifth transmission line transformer connected between the combination terminal and a fourth input terminal to which the second signal is inputted and configured to perform impedance transformation at the third transformation ratio so that an impedance decreases, a sixth transmission line transformer connected between the combination terminal and an output terminal and configured to perform impedance transformation at a fourth transformation ratio so that an impedance increases, and a second isolation section connected between the third input terminal and the fourth input terminal.

5. The power amplifier module according to claim 1, wherein the combiner includes:

a combination terminal at which the first signal and the second signal are combined, a fourth transmission line transformer connected between the combination terminal and a third input terminal to which the first signal is inputted and configured to perform impedance transformation at a third transformation ratio so that an impedance decreases, a fifth transmission line transformer connected between the combination terminal and a fourth input terminal to which the second signal is inputted and configured to perform impedance transformation at the third transformation ratio so that an impedance decreases, a sixth transmission line transformer connected between the combination terminal and an output terminal and configured to perform impedance transformation at a fourth transformation ratio so that an impedance increases, and a second isolation section connected between the third input terminal and the fourth input terminal.

6. A power amplifier module comprising:

a first amplifier configured to amplify a power level of a first input signal in a predetermined frequency band and output a first signal of a first power level;

a first impedance transformer connected to the first amplifier and including a transmission line transformer;

a second amplifier configured to amplify a power level of a second input signal in the predetermined frequency band and output a second signal of the first power level;

a second impedance transformer connected to the second amplifier and including a transmission line transformer; and a combiner configured to combine the first signal inputted through the first impedance transformer and the second signal inputted through the second impedance transformer into an output signal of a second power level larger than the first power level, the combiner including a transmission line transformer, wherein the combiner includes;

a combination terminal at which the first signal and the second signal are combined, a seventh transmission line transformer configured to perform impedance transformation at a fifth transformation ratio so that an impedance increases, an eighth transmission line transformer connected in series with the seventh transmission line transformer through a first connection terminal and configured to perform impedance transformation at a sixth transformation ratio so that the impedance decreases, a ninth transmission line transformer configured to perform impedance transformation at the fifth transformation ratio so that an impedance increases, a tenth transmission line transformer connected in series with the ninth transmission line transformer through a second connection terminal and configured to perform impedance transformation at the sixth transformation ratio so that the impedance decreases, and a third isolation section, wherein the seventh transmission line transformer is connected between the first connection terminal and a fifth input terminal to which the first signal is inputted, wherein the eighth transmission line transformer is connected between the first connection terminal and the combination terminal, wherein the ninth transmission line transformer is connected between the second connection terminal and a sixth input terminal to which the second signal is inputted, wherein the tenth transmission line transformer is connected between the second connection terminal and the combination terminal, and wherein the third isolation section is connected between the fifth input terminal and the sixth input terminal.

7. The power amplifier module according to claim 1, wherein the combiner includes:
   a combination terminal at which the first signal and the second signal are combined,
   a seventh transmission line transformer configured to perform impedance transformation at a fifth transformation ratio so that an impedance increases,
   an eighth transmission line transformer connected in series with the seventh transmission line transformer through a first connection terminal and configured to perform impedance transformation at a sixth transformation ratio so that the impedance decreases,
   a ninth transmission line transformer configured to perform impedance transformation at the fifth transformation ratio so that an impedance increases,
   a tenth transmission line transformer connected in series with the ninth transmission line transformer through a second connection terminal and configured to perform impedance transformation at the sixth transformation ratio so that the impedance decreases, and
   a third isolation section, wherein the seventh transmission line transformer is connected between the first connection terminal and a fifth input terminal to which the first signal is inputted, wherein the eighth transmission line transformer is connected between the first connection terminal and the combination terminal, wherein the ninth transmission line transformer is connected between the second connection terminal and a sixth input terminal to which the second signal is inputted, wherein the tenth transmission line transformer is connected between the second connection terminal and the combination terminal, and wherein the third isolation section is connected between the fifth input terminal and the sixth input terminal.

8. A power amplifier module comprising:
   a first amplifier configured to amplify a power level of a first input signal in a predetermined frequency band and output a first signal of a first power level;
   a first impedance transformer connected to the first amplifier and including a transmission line transformer;
   a second amplifier configured to amplify a power level of a second input signal in the predetermined frequency band and output a second signal of the first power level;
   a second impedance transformer connected to the second amplifier and including a transmission line transformer; and
   a combiner configured to combine the first signal inputted through the first impedance transformer and the second signal inputted through the second impedance transformer into an output signal of a second power level larger than the first power level, the combiner including a transmission line transformer, wherein the combiner includes:
   a combination terminal at which the first signal and the second signal are combined,
   an eleventh transmission line transformer configured to perform impedance transformation at a seventh transformation ratio so that an impedance decreases,
   a twelfth transmission line transformer connected in series with the eleventh transmission line transformer through a third connection terminal and configured to perform impedance transformation at an eighth transformation ratio so that the impedance increases,
   a thirteenth transmission line transformer configured to perform impedance transformation at the seventh transformation ratio so that an impedance decreases,
   a fourteenth transmission line transformer connected in series with the thirteenth transmission line transformer through a fourth connection terminal and configured to perform impedance transformation at the eighth transformation ratio so that the impedance increases, and
   a fourth isolation section, wherein the eleventh transmission line transformer is connected between the third connection terminal and a seventh input terminal to which the first signal is inputted, wherein the twelfth transmission line transformer is connected between the third connection terminal and the combination terminal, wherein the thirteenth transmission line transformer is connected between the fourth connection terminal and an eighth input terminal to which the second signal is inputted, wherein the fourteenth transmission line transformer is connected between the fourth connection terminal and the combination terminal, and wherein the fourth isolation section is connected between the seventh input terminal and the eighth input terminal.

9. The power amplifier module according to claim 1, wherein the combiner includes:
   a combination terminal at which the first signal and the second signal are combined,
   an eleventh transmission line transformer configured to perform impedance transformation at a seventh transformation ratio so that an impedance decreases,
   a twelfth transmission line transformer connected in series with the eleventh transmission line transformer through a third connection terminal and configured to perform impedance transformation at an eighth transformation ratio so that the impedance increases,
   a thirteenth transmission line transformer configured to perform impedance transformation at the seventh transformation ratio so that an impedance decreases,
   a fourteenth transmission line transformer connected in series with the thirteenth transmission line transformer through a fourth connection terminal and configured to perform impedance transformation at the eighth transformation ratio so that the impedance increases, and
   a fourth isolation section, wherein the eleventh transmission line transformer is connected between the third connection terminal and a seventh input terminal to which the first signal is inputted, wherein the twelfth transmission line transformer is connected between the third connection terminal and the combination terminal, wherein the thirteenth transmission line transformer is connected between the fourth connection terminal and an eighth input terminal to which the second signal is inputted, wherein the fourteenth transmission line transformer is connected between the fourth connection terminal and the combination terminal, and wherein the fourth isolation section is connected between the seventh input terminal and the eighth input terminal.

10. A power amplifier module comprising:
a first amplifier configured to amplify a power level of a first input signal in a predetermined frequency band and output a first signal of a first power level;
a first impedance transformer connected to the first amplifier and including a transmission line transformer;
a second amplifier configured to amplify a power level of a second input signal in the predetermined frequency band and output a second signal of the first power level;
a second impedance transformer connected to the second amplifier and including a transmission line transformer; and
a combiner configured to combine the first signal inputted through the first impedance transformer and the second signal inputted through the second impedance transformer into an output signal of a second power level larger than the first power level, the combiner including a transmission line transformer,
wherein the combiner includes:
a combination terminal at which the first signal and the second signal are combined,
a fifteenth transmission line transformer including a first end portion that is connected to a ninth input terminal and to which the first signal is inputted, a second end portion that is connected to a tenth input terminal and to which the second signal is inputted, and a third end portion connected to the combination terminal, and configured to perform impedance transformation at a ninth transformation ratio so that an impedance decreases,
a sixteenth transmission line transformer connected in series with the fifteenth transmission line transformer through the combination terminal and connected between the combination terminal and an output terminal, and configured to perform impedance transformation at a tenth transformation ratio so that the impedance increases, and
a fifth isolation section connected between the ninth input terminal and the tenth input terminal.

11. The power amplifier module according to claim 1, wherein the combiner includes:
a combination terminal at which the first signal and the second signal are combined,
a fifteenth transmission line transformer including a first end portion that is connected to a ninth input terminal and to which the first signal is inputted, a second end portion that is connected to a tenth input terminal and to which the second signal is inputted, and a third end portion connected to the combination terminal, and configured to perform impedance transformation at a ninth transformation ratio so that an impedance decreases,
a sixteenth transmission line transformer connected in series with the fifteenth transmission line transformer through the combination terminal and connected between the combination terminal and an output terminal, and configured to perform impedance transformation at a tenth transformation ratio so that the impedance increases, and
a fifth isolation section connected between the ninth input terminal and the tenth input terminal.

12. A power amplifier module comprising:
a first amplifier configured to amplify a power level of a first input signal in a predetermined frequency band and output a first signal of a first power level;
a first impedance transformer connected to the first amplifier and including a transmission line transformer;
a second amplifier configured to amplify a power level of a second input signal in the predetermined frequency band and output a second signal of the first power level;
a second impedance transformer connected to the second amplifier and including a transmission line transformer; and
a combiner configured to combine the first signal inputted through the first impedance transformer and the second signal inputted through the second impedance transformer into an output signal of a second power level larger than the first power level, the combiner including a transmission line transformer,
wherein the combiner includes;
a seventeenth transmission line transformer connected to a first duplexer that separates a reception signal and the first signal and configured to perform impedance transformation at an eleventh transformation ratio,
an eighteenth transmission line transformer connected to a second duplexer that separates a reception signal and the second signal and configured to perform impedance transformation at the eleventh transformation ratio, and
an antenna switch including an eleventh input terminal to which the first signal is inputted through the seventeenth transmission line transformer, a twelfth input terminal to which the second signal is inputted through the eighteenth transmission line transformer, a fourth output terminal connected to a first antenna, a fifth output terminal connected to a second antenna different from the first antenna, and sixth output terminals connected to a combination terminal at which the first signal and the second signal are combined.

13. The power amplifier module according to claim 12, wherein the combiner includes a nineteenth transmission line transformer connected between the combination terminal and an output terminal and configured to perform impedance transformation at a twelfth transformation ratio.

14. A power amplifier module comprising:
a first amplifier configured to amplify a power level of a first input signal in a predetermined frequency band and output a first signal of a first power level;
a first impedance transformer connected to the first amplifier and including a transmission line transformer;
a second amplifier configured to amplify a power level of a second input signal in the predetermined frequency band and output a second signal of the first power level;

a second impedance transformer connected to the second amplifier and including a transmission line transformer; and a combiner configured to combine the first signal inputted through the first impedance transformer and the second signal inputted through the second impedance transformer into an output signal of a second power level larger than the first power level, the combiner including a transmission line transformer, wherein the combiner receives input of the first signal and the second signal through band selection switches configured to distribute the first signal and the second signal in accordance with the predetermined frequency band.

15. A power amplifier module comprising:

a first amplifier configured to amplify a power level of a first input signal in a predetermined frequency band and output a first signal of a first power level;

a first impedance transformer connected to the first amplifier and including a transmission line transformer;

a second amplifier configured to amplify a power level of a second input signal in the predetermined frequency band and output a second signal of the first power level;

a second impedance transformer connected to the second amplifier and including a transmission line transformer; and a combiner configured to combine the first signal inputted through the first impedance transformer and the second signal inputted through the second impedance transformer into an output signal of a second power level larger than the first power level, the combiner including a transmission line transformer, wherein the combiner receives input of the first signal and the second signal through duplexers configured to distribute the first signal and the second signal, and a received reception signal.

16. The power amplifier module according to claim 1, wherein the combiner receives input of the first signal and the second signal through duplexers configured to distribute the first signal and the second signal, and a received reception signal.

17. The power amplifier module according to claim 1, wherein the predetermined frequency band is a frequency band from 1710 MHz to 2690 MHz.

18. The power amplifier module according to claim 2, wherein the predetermined frequency band is a frequency band from 1710 MHz to 2690 MHz.

19. The power amplifier module according to claim 1, wherein the combiner is connected between the antenna switch and the first antenna and the second antenna.

* * * * *